US011870462B2

(12) United States Patent
Zheng et al.

(10) Patent No.: US 11,870,462 B2
(45) Date of Patent: Jan. 9, 2024

(54) FAULT TOLERANT AND ERROR CORRECTION DECODING METHOD AND APPARATUS FOR QUANTUM CIRCUIT, AND CHIP

(71) Applicant: Tencent Technology (Shenzhen) Company Limited, Guangdong (CN)

(72) Inventors: Yicong Zheng, Shenzhen (CN); Shengyu Zhang, Shenzhen (CN)

(73) Assignee: Tencent Technology (Shenzhen) Company Limited, Guangdong (CN)

( * ) Notice: Subject to any disclaimer, the term of this patent is extended or adjusted under 35 U.S.C. 154(b) by 310 days.

(21) Appl. No.: 17/463,090

(22) Filed: Aug. 31, 2021

(65) Prior Publication Data

US 2021/0399743 A1     Dec. 23, 2021

Related U.S. Application Data

(63) Continuation of application No. PCT/CN2021/073296, filed on Jan. 22, 2021.

(30) Foreign Application Priority Data

Apr. 15, 2020   (CN) .......................... 202010296673.1

(51) Int. Cl.
*H03M 13/00*     (2006.01)
*H03M 13/15*     (2006.01)
(Continued)

(52) U.S. Cl.
CPC ...... *H03M 13/1575* (2013.01); *G06F 30/367* (2020.01); *G06N 10/00* (2019.01)

(58) Field of Classification Search
CPC ... H03M 13/1575; G06N 10/00; G06F 30/367
See application file for complete search history.

(56) References Cited

U.S. PATENT DOCUMENTS 11,710,058 B2 *  7/2023  Hogaboam ............ G06N 10/00
                                                      257/27
2008/0185576 A1 *  8/2008  Hollenberg ............ G06N 10/00
                                                      257/14
(Continued)

FOREIGN PATENT DOCUMENTS

CN        110011671 A       7/2019
CN        110518920 A      11/2019
(Continued)

OTHER PUBLICATIONS

Office Action for corresponding Korean application No. 10-2021-7035047 dated May 31, 2023, 39, in Korean language.
(Continued)

*Primary Examiner* — Samir W Rizk
(74) *Attorney, Agent, or Firm* — Crowell & Moring LLP

(57) ABSTRACT

This disclosure discloses a fault tolerant and error correction decoding method and apparatus for a quantum circuit, and a chip. This disclosure relates to the field of artificial intelligence (AI) and quantum technologies. The method includes: obtaining actual error syndrome information of a quantum circuit by performing a noisy error syndrome measurement on the quantum circuit by using a quantum error correction (QEC) code; decoding the actual error syndrome information to obtain a logic error class and perfect error syndrome information that correspond to the actual error syndrome information; and determining error result information of the quantum circuit based on the logic error class and the perfect error syndrome information, the error result information being indicative of a data qubit in which an error occurs in the quantum circuit and a corresponding error class.

20 Claims, 18 Drawing Sheets

(51) Int. Cl.
*G06N 10/00* (2022.01)
*G06F 30/367* (2020.01)

(56) References Cited

U.S. PATENT DOCUMENTS

2009/0259905 A1   10/2009   Silva et al.
2019/0042969 A1*   2/2019   Hogaboam ............ G06N 10/00

FOREIGN PATENT DOCUMENTS

CN   111510157 A   8/2020
CN   111510158 A   8/2020

OTHER PUBLICATIONS

English language Summary of Office Action for corresponding Korean application No. 10-2021-7035047 dated May 31, 2023, 2p.
International Search Report and Written Opinion for priority application No. PCT/CN2021/073296, dated Apr. 28, 2021, 9p, in Chinese language.
Concise Explanation of Relevance.
Extended European Search Report for application No. EP 217732684. dated Jun. 20, 2022, 9p.
Chuang, Isaac L. et al., "Prescription for experimental determination of the dynamics of a quantum black box", Cornell University Library, Feb. 9, 2008, 6p, DOI: 10.1080/09500349708231894, US.
Varsamopoulos, Savvas, "Neural Network based Decoders forthe Surface Code" PhD Dissertation at Delft University of Technology, found on the internet @ https://pure.tudelft.nl/ws/portalfiles/portal/53489744/Dissertation_Savvas_Varsamopoulos.pdf, Jun. 4, 2019, 128p, DOI: 10.4233/uuid:dc73elff-04960459a-986f-de37f7f250c9, NL.
Bermudez, A. et al., "Fault-tolerant protection of near-term trapped-ion topological qubits under realistic noise sources", A Physical Review, found on the internet @ https://arxiv.org/pdf/1810.09199.pdf, Nov. 4, 2019, 24p, vol. 100, No. 6, DOI: 10.1103/PhysRevA.100.062307.

* cited by examiner

FAULT TOLERANT AND ERROR CORRECTION DECODING METHOD AND APPARATUS FOR QUANTUM CIRCUIT, AND CHIP

RELATED APPLICATION

This application is a continuation of PCT Application No. PCT/CN2021/073296, filed on Jan. 22, 2021, which claims priority to Chinese Patent Application No. 202010296673.1, filed on Apr. 15, 2020 and entitled "FAULT TOLERANT AND ERROR CORRECTION DECODING METHOD AND APPARATUS FOR QUANTUM CIRCUIT, AND CHIP." The above applications are incorporated herein by reference in their entireties.

TECHNICAL FIELD

Embodiments of this disclosure relate to the field of artificial intelligence (AI) and quantum technologies, and in particular, to a fault tolerant and error correction decoding method and apparatus for a quantum circuit, and a chip.

BACKGROUND

Since qubits are quite susceptible to noise, with current technologies, it is still not practical to directly implement quantum computation (QC) on physical qubits. The development of quantum error correction (QEC) code technology and fault tolerant quantum computation (FTQC) technology makes it possible, in principle, to implement QC with arbitrary precision on noisy qubits.

After error syndrome information is obtained by measuring error syndromes of a quantum circuit by using a QEC code, the error syndrome information may be decoded by using a decoding algorithm, to determine a data qubit where an error occurs in the quantum circuit and a corresponding error class. For a case that the error syndrome information is perfect (that is, the error syndrome measurement is noise-free), it is proposed in the related art to use a neural network decoder to decode the error syndrome information to obtain corresponding error result information.

However, in actual situations, the error syndrome information is not perfect (that is, the error syndrome measurement is noisy). There is no effective solution at present for how to perform real-time fault tolerant and error correction decoding on the error syndrome information in such actual situations.

SUMMARY

Embodiments of this disclosure provide a fault tolerant and error correction decoding method and apparatus for a quantum circuit, and a chip, which achieves real-time fault tolerant and error correction decoding on error syndrome information of a quantum circuit when the error syndrome information is not perfect. The technical solutions are as follows:

According to an aspect, an embodiment of this disclosure provides a fault tolerant and error correction decoding method for a quantum circuit, applicable to a computer device, the method including:

obtaining actual error syndrome information of a quantum circuit by performing a noisy error syndrome measurement on the quantum circuit using a QEC code;

decoding the actual error syndrome information to obtain a logic error class and perfect error syndrome information, which correspond to the actual error syndrome information, the logic error class being a class obtained through mapping of an error occurring in the quantum circuit, and the perfect error syndrome information being obtained by performing a noise-free error syndrome measurement on the quantum circuit; and determining error result information of the quantum circuit based on the logic error class and the perfect error syndrome information, the error result information being indicative of a data qubit in which an error occurs in the quantum circuit and a corresponding error class.

According to another aspect, an embodiment of this disclosure provides a fault tolerant and error correction decoding apparatus for a quantum circuit, the apparatus including:

a syndrome information obtaining module, configured to obtain actual error syndrome information of a quantum circuit, the actual error syndrome information being information obtained by performing a noisy error syndrome measurement on the quantum circuit by using a QEC code;

a syndrome information decoding module, configured to decode the actual error syndrome information to obtain a logic error class and perfect error syndrome information that correspond to the actual error syndrome information, the logic error class being a class obtained through mapping of an error occurring in the quantum circuit, and the perfect error syndrome information being information obtained by performing a noise-free error syndrome measurement on the quantum circuit; and an error result determining module, configured to determine error result information of the quantum circuit based on the logic error class and the perfect error syndrome information, the error result information being used for indicating a data qubit in which an error occurs in the quantum circuit and a corresponding error class.

According to another aspect, an embodiment of this disclosure provides a computer device, including a processor and a memory, the memory storing at least one instruction, at least one program segment, a code set, or an instruction set, the at least one instruction, the at least one program segment, the code set, or the instruction set being loaded and executed by the processor to implement the foregoing fault tolerant and error correction decoding method for a quantum circuit.

According to another aspect, an embodiment of this disclosure provides a computer-readable storage medium, storing at least one instruction, at least one program segment, a code set, or an instruction set, the at least one instruction, the at least one program segment, the code set, or the instruction set being loaded and executed by a processor to implement the foregoing fault tolerant and error correction decoding method for a quantum circuit.

According to still another aspect, an embodiment of this disclosure provides an electronic component, such as a chip, including a programmable logic circuit and/or program instructions, the electronic component being configured to run on a computer device to cause the computer device to perform the fault tolerant and error correction decoding methods for a quantum circuit as disclosed herein.

According to yet another aspect, an embodiment of this disclosure provides a computer program product or a computer program, the computer program product or the computer program including computer instructions, the computer instructions being stored in a computer-readable storage medium. A processor of a computer device reads the computer instructions from the computer-readable storage medium and executes the computer instructions to cause the computer device to perform the fault tolerant and error correction decoding methods for a quantum circuit as disclosed herein.

The technical solutions provided in the embodiments of this disclosure include at least the following beneficial effects:

By decoding actual error symptom information of a quantum circuit to obtain a corresponding logic error class and corresponding perfect error syndrome information and then determining a data qubit in which an error occurs in the quantum circuit and a corresponding error class according to the logic error class and the perfect error syndrome information, this disclosure achieves fault tolerant and error correction decoding on error syndrome information of the quantum circuit when the error syndrome information is not perfect. In addition, this solution equivalently transforms fault tolerant and error correction decoding into a classification problem, so that fault tolerant and error correction decoding can be performed on error syndrome information by using an efficient neural network classifier, thereby improving the fault tolerant and error correction decoding speed, and achieving real-time fault tolerant and error correction decoding.

BRIEF DESCRIPTION OF THE DRAWINGS

To describe the technical solutions of the embodiments of this disclosure more clearly, the following briefly introduces the accompanying drawings required for describing the embodiments. Apparently, the accompanying drawings in the following description show only some embodiments of this disclosure, and a person of ordinary skill in the art may still derive other drawings from these accompanying drawings without creative efforts.

DESCRIPTION OF EMBODIMENTS

Figure 1:
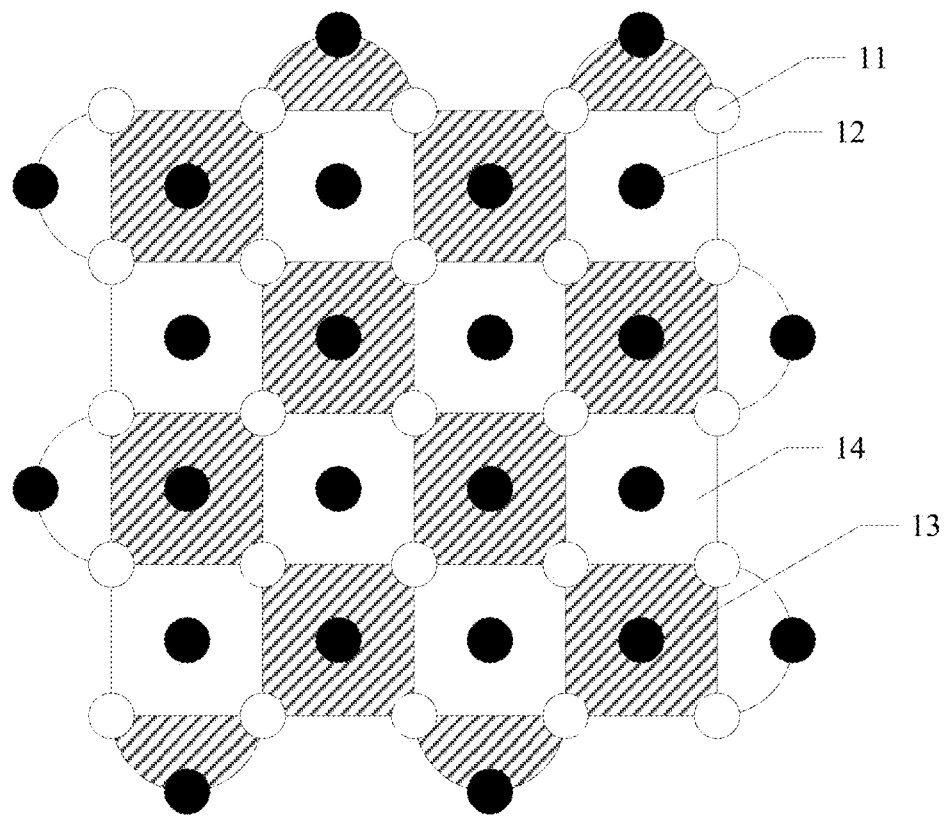
FIG. 1 is a schematic structural diagram of a surface code according to an embodiment of this disclosure.

To make the objectives, technical solutions, and advantages of this disclosure clearer, the following further describes implementations of this disclosure in detail with reference to the accompanying drawings.

Before the embodiments of this disclosure are described, some terms involved in this disclosure are introduced first.

1. Quantum computation (QC): QC is a scheme of using superposition and entanglement properties of quantum states to rapidly complete a specific computation task.

2. Quantum teleportation: Quantum teleportation is a technology of transporting any unknown quantum state by any distance in a manner of distributing quantum entangled states and transmitting some classical information.

3. Quantum error correction (QEC): QEC is a scheme of mapping a quantum state to a subspace in the Hilbert space of a many-body quantum system for encoding. Quantum noise may cause an encoded quantum state to be transferred to another subspace. By continuously observing a space in which a quantum state is located (syndrome extraction), quantum noise can be evaluated and corrected without interfering with the encoded quantum state, to protect the encoded quantum state against interference from the quantum noise. Specifically, for a QEC code $[[n,k,d]]$ it represents that k logical qubits are encoded in n physical qubits, to correct any $\lfloor(d-1)/2\rfloor$ errors that occur on any single qubit.

4. Data quantum state: A data quantum state is used for storing a quantum state of a data qubit of quantum information during QC.

5. Stabilizer generator: A stabilizer generator is also referred to as a parity check operator. Occurrence of quantum noise (an error) changes eigenvalues of some stabilizer generators, so QEC can be performed according to such information.

6. Stabilizer group: A stabilizer group is a group generated by stabilizer generators. If there are k stabilizer generators, the stabilizer group includes $2^k$ elements, and this is an abelian group.

7. Error syndrome: When there is no error, eigenvalues of stabilizer generators are 0; when quantum noise occurs, eigenvalues of some stabilizer generators (parity check operators) of the error correction code change into 1. A bit string formed by these syndrome bits 0 and 1 are referred to as an error syndrome.

8. Syndrome measurement circuit: A syndrome measurement circuit, also referred to as a checking circuit, is a quantum circuit for obtaining an error syndrome. Generally, the circuit itself is also contaminated with noise.

9. Topological quantum error correction (QEC) code: A topological QEC code is a special type of QEC code. Qubits of this type of error correction code are distributed on a grid array greater than two dimensions. Grids form a discrete structure of a high-dimensional manifold. In this case, stabilizer generators of the error correction code are defined on limited and geometrically neighboring qubits, all of which are geometrically local and easy to measure. Qubits on which logic operators of this type of correction code act form a class of geometric objects with non-trivial topologies on a manifold of the grid array.

10. Surface code: A surface code belongs to a class of topological QEC code defined on a two-dimensional manifold. A stabilizer generator of the surface code is generally supported by four qubits (supported by two qubits at a boundary), and a logic operator of the surface code is a non-trivial chain of a strip-shaped spanning array. A specific two-dimensional structure of the surface code (5×5, which has 25 data qubits and 24 auxiliary qubits in total, and can correct any errors occurring on two qubits) is shown in FIG. 1: white circles 11 represent the data qubits used for QC, and black circles 12 represents the auxiliary qubits. The auxiliary qubits are initially prepared in a |0⟩ or |+⟩ state. Blocks (or semicircles) 13 filled with slashes and clocks (or semicircles) 14 in white represent two different types of stabilizer generators, which are respectively used for detecting Z errors and X errors. In this disclosure, a rotated surface code shown in FIG. 1 will be used, because it can save approximately a half of physical qubits, and is more convenient to be verified in a recent experiment.

11. Surface code scale L: A surface code scale L is a quarter of a circumference of a surface code array. The surface code scale L in FIG. 1 is equal to 5.

12. Stabilizer code: A stabilizer code is a QEC code defined by a group of stabilizer generators. The stabilizer generators are a group of Pauli operators that commutate with each other and independently act on n qubits. Eigensubspaces of the group of Pauli operators that have a common eigenvalue +1 are an encoding space of the stabilizer code.

13. Homology class: In a topology, a homology class in a homology theory is represented by a limited linear combination of geometric sub-objects having a boundary of 0. If geometric objects of the linear combination can be regarded as boundaries of geometric objects having more than one dimension, it is considered that the linear combination is homologous to "0" (in which the 0 herein refers to a trivial class in the topological sense, which are geometric objects that can be continuously contracted to points). In the following, the homology class sometimes is mixed with an "error class."

14. X and Z error: An X error and a Z error are a Pauli-X evolution error and a Pauli-Z evolution error that are randomly generated on a quantum state of a physical qubit. According to the QEC theory, provided that an error correction code can be used to correct an X error and a Z error, the error correction code can be used to correct any error that occurs on a single qubit.

15. Fault tolerant quantum error correction (FTQEC): There is noise in all operation processes during actual QC including a quantum gate measurement and quantum measurement. That is, a circuit configured for QEC also contains noise. FTQEC means that an error correction circuit with noise can be used for correction by skillfully designing the error correction circuit, and an objective of correcting an error and prevent the error from propagating over time can still be achieved.

16. Fault tolerant quantum computation (FTQC): FTQC is QC under QEC protection. During QC, there is noise in any physical operation, including an operation on a QEC circuit itself and qubit measurement. FTQC is a technical solution in which a method of properly designing a QEC scheme and performing a gate operation in a specific manner on an encoded logic quantum state is used to ensure effective control and error correction during QC using qubits with noise.

17. Physical qubit: A physical qubit is a qubit implemented by using an actual physical device.

18. Logical qubit: A logical qubit is a mathematical degree of freedom in the Hilbert subspace defined by an error correction code. The description of a quantum state of the logical qubit is usually a many-body entangled state, and the logical qubit is generally encoded into two-dimensional subspaces of a joint Hilbert space of a plurality of physical qubits. FTQC needs to run on a logical qubit protected by an error correction code.

19. Physical quantum gate/circuit: A physical quantum gate/circuit is a quantum gate/circuit that acts on a physical qubit.

20. Logic quantum gate/circuit: A logic quantum gate/circuit is a quantum gate/circuit that acts on a logical qubit.

21. Data error: A data error is an error occurring on a data qubit.

22: Measurement error: A measurement error is an error caused by an not perfect measurement process.

23. Threshold theorem: In a threshold theorem, for a computation scheme that meets an FTQC requirement, when error rates of all operations are less than a threshold, a better error correction code, more qubits, and more quantum operations may be used to enable the accuracy of computation to approximate to 1. In addition, these additional resource overheads may be ignored when compared with exponential speedup of QC.

24. Neural network: An artificial neural network is an adaptive non-linear dynamic system, which includes a large quantity of simple basic elements—neurons connected to each other. The structure and functions of each neuron are relatively simple, but system behaviors generated by a combination of the large quantity of neurons are quite complex, which may express any function in principle.

The technical solution in this disclosure relates to the field of quantum technologies and AI technologies. AI is a theory, method, technology, and application system that uses a digital computer or a machine controlled by the digital computer to simulate, extend, and expand human intelligence, perceive an environment, acquire knowledge, and use knowledge to obtain an optimal result.

The AI technology is a comprehensive discipline, and relates to a wide range of fields including both hardware-level technologies and software-level technologies.

ML is a multi-field interdiscipline, and relates to a plurality of disciplines such as the probability theory, statistics, the approximation theory, convex analysis, and the algorithm complexity theory. ML specializes in studying how a computer simulates or implements a human learning behavior to obtain new knowledge or skills, and reorganize an existing knowledge structure, so as to keep improving its performance. ML is the core of AI, is a basic way to make the computer intelligent, and is applied to various fields of AI. The ML and deep learning generally include technologies such as an artificial neural network, a belief network, reinforcement learning, transfer learning, inductive learning, and learning from demonstrations.

With the research and progress of the AI technology, the AI technology is studied and applied in a plurality of fields such as a common smart home, a smart wearable device, a virtual assistant, a smart speaker, smart marketing, unmanned driving, automatic driving, an unmanned aerial vehicle, a robot, smart medical care, and smart customer service. It is believed that with the development of technologies, the AI technology will be applied to more fields, and play an increasingly important role.

The solutions provided in the embodiments of this disclosure involve application of machine learning technologies of AI in the field of quantum technologies, and specifically relate to application of the machine learning technologies in a decoding algorithm for QEC codes, which are specifically described by using the following embodiments.

As an error correction code, after an error occurs, error syndromes can be obtained through parity check; then a position in which the error occurs and an error class (the error is an X error, a Z error, or both of the two, that is, a Y error) are determined according to the syndromes by using a specific decoding algorithm for error correction codes. For a surface code, an error and an error syndrome have specific spatial positions: when an error causes syndromes, an eigenvalue of an auxiliary qubit in a corresponding position is 1 (which can be regarded as that a point particle occurs in the position); on the other hand, when there is no error, the eigenvalue of the auxiliary qubit in the corresponding position is 0. A decoding process may be summarized as that the following: A spatial digital array (which is two-dimensional or three-dimensional and has a value of 0 or 1) is given; qubits in which errors most possibly occur and a specific error class are deduced according to a particular error occurrence model; and error correction is performed according to a result of the deduction.

Figure 2:
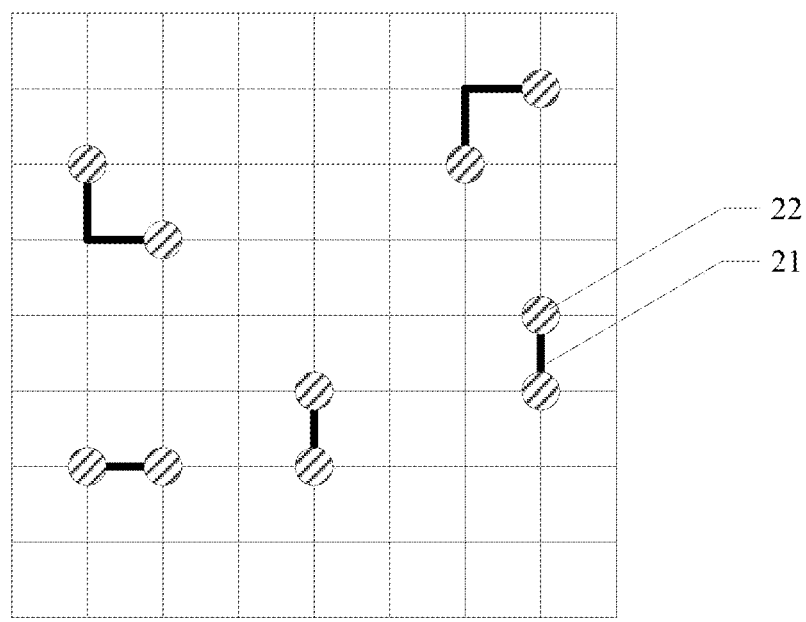
FIG. 2 is a schematic diagram showing occurrence of an error of a surface code according to an embodiment of this disclosure.

FIG. 2 is a schematic diagram showing occurrence of an error of a surface code. The qubit is on an edge of a two-dimensional array, and an auxiliary qubit for measuring error syndromes is on a node of the two-dimensional array (these syndromes are perfectly measured). Black edges 21 in FIG. 2 represent error chains formed by qubits in which an error occurs, and circle parts 22 filled with slashes represent points that are caused by the error and have syndrome values of 1. Decoding can be completed provided that a chain-shaped error can be determined based on point-shaped syndromes.

It is already described above that corresponding error result information, for example, a position in which an error occurs and an error class, can be obtained by decoding error syndrome information by using a decoding algorithm (which may alternatively be referred to as a decoder) for QEC codes. If error syndrome information is perfect (that is, there is no noise in a measurement process), the error syndrome information may be decoded by using a decoder constructed based on a neural network (which may be referred to as neural network decoder) to obtain corresponding error result information. Because a decoding process is an input/output function, a neural network may be constructed, and a correct input/output result is used to train a neural network, to learn accurately determining a position and a class of an error (supervised learning). Errors may be classified into two classes according to different neural network decoder output classes: one is a physical class, and the other is a logic class. A physical-class output model directly generates specific qubit information corresponding to occurrence of an error, that is, an error of which class occurs on a specific qubit. A logic-class output model outputs a logic error class (for a surface code, a homology class is outputted) obtained after particular mapping of a specific error, and then a specific equivalent error occurring on the qubit is reversely deduced according to the logic error class (the deduced error is unnecessarily completely the same as the error originally occurs, but generates the same effect, which is a unique error degeneration phenomenon of QEC codes). Logic-class error correction is equivalent to a homology class classification problem if a syndrome in perfect (e.g., when there is no noise in a measurement process), which is applicable to performing deduction classification by a neural network after supervised learning training, but is not completely applicable to a fault tolerant and error correction problem. A relatively common neural network decoding algorithm uses a fully connected network, a convolutional neural network (CNN), a recurrent neural network (RNN), and the like. Most operations of neural network are matrix operations, which can be highly parallelized and is quite suitable to be run on a specific hardware (for example, a field programmable gate array (FPGA) or an application specific integrated circuit (ASIC) with a very short real-time computation time.

If error syndrome information is not perfect (which may be referred to as syndrome measurement with noise, and refers to a case that an error may occur in a measurement process), it is also expected that a neural network decoder can be used for decoding, thereby implementing fault tolerant and error correction decoding for the error syndrome information.

In this disclosure, a mathematical framework is constructed, to approximately change a fault tolerant and error correction decoding problem into a plurality of classification problems, and how to locate a position in which an error occurs and determine an error class according to a classification result is given. These classification problems may be performed in parallel at the same time, and consumes approximately the same time, thereby bringing no more delays. Based on the theory framework, a specific protocol in which a neural network decoder (inputted error syndrome information is a three-dimensional data array) is used for decoding during fault tolerant and error correction is proposed, and fault tolerance of error correction is proved.

Figure 3:
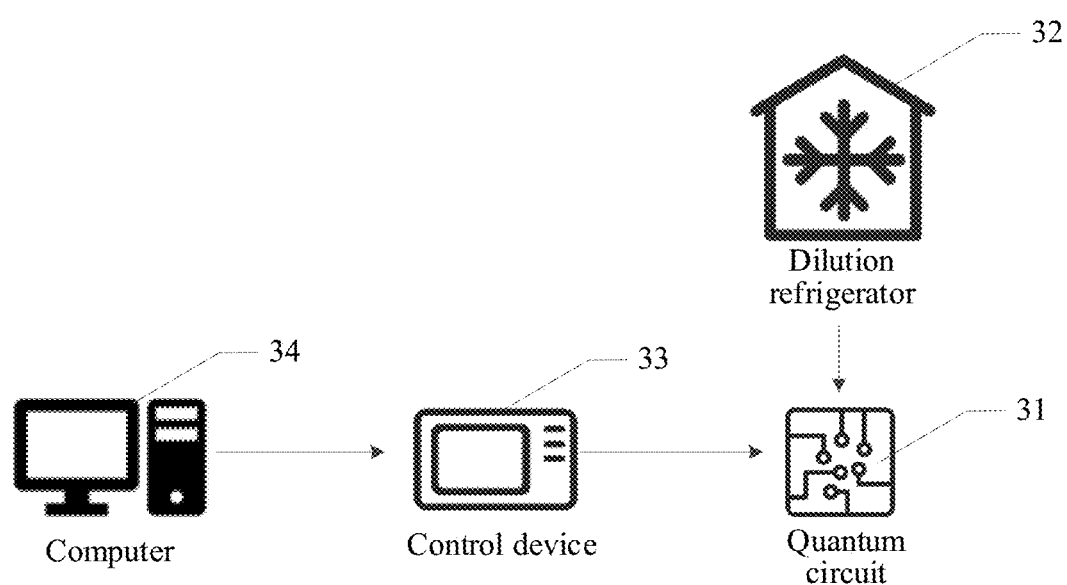
FIG. 3 is a schematic diagram of an application scenario of a solution according to an embodiment of this disclosure.

FIG. 3 is a schematic diagram of an application scenario of a solution according to an embodiment of this disclosure. As shown in FIG. 3, the application scenario may be a superconducting quantum computing platform. The application scenario includes: a quantum circuit 31, a dilution refrigerator 32, a control device 33, and a computer 34.

The quantum circuit 31 is a circuit acting on physical qubits, and may be implemented as a quantum chip, for example, a superconducting quantum chip located near absolute zero. The dilution refrigerator 32 is configured to provide an environment of absolute zero for the superconducting quantum chip.

The control device 33 is configured to control the quantum circuit 31, and the computer 34 is configured to control the control device 33. For example, a programmed quantum program is compiled into an instruction by using software in the computer 34 and transmitted to the control device 33, and the control device 33 transforms the instruction into an electronic/microwave control signal and inputs the electronic/microwave control signal into the dilution refrigerator 32, to control superconducting qubits at 10 mK. A reading process is opposite to the above.

Figure 4:
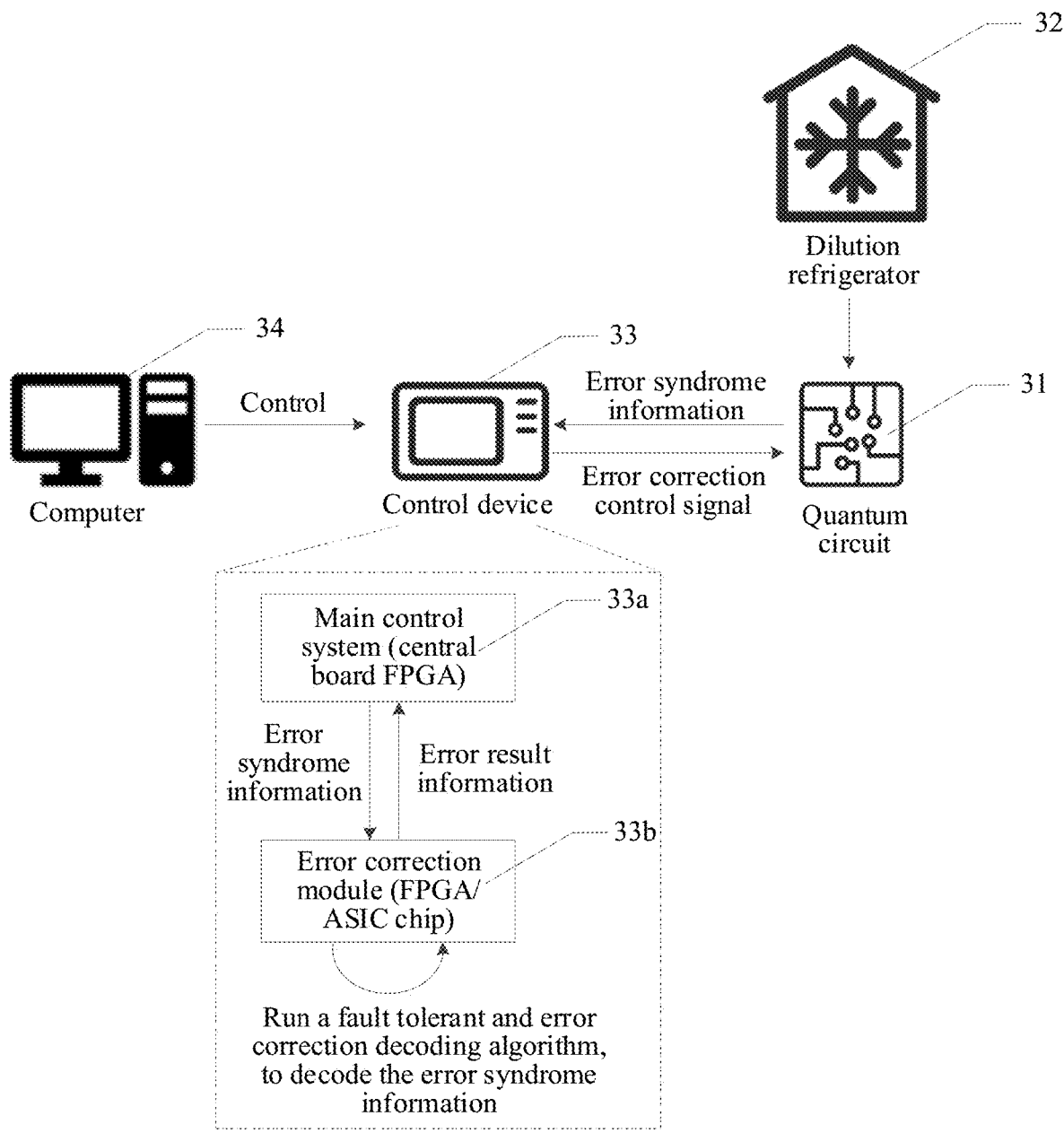
FIG. 4 is a schematic diagram of a fault tolerant and error correction decoding process involved in the application scenario of the solution shown in FIG. 3.

As shown in FIG. 4, the fault tolerant and error correction decoding method for a quantum circuit provided in this embodiment of this disclosure may be combined with the control device 33. After measuring error syndrome information from the quantum circuit 31, a main control system 33a (for example, a central board FPGA) of the control device 33 transmits an error correction instruction to an error correction module 33b of the control device 33. The error correction instruction includes error syndrome information of the quantum circuit 31. The error correction module 33b may be an FPGA or an ASIC chip. The error correction module 33b runs a fault tolerant and error correction decoding algorithm to decode the error syndrome information, and transforms, in a real-time manner, error result information obtained through decoding into an error correction control signal and transmits the error correction control signal to the quantum circuit 31 for error correction.

A neural network decoder (which may be referred to as a neural network classifier) may be used for decoding the error syndrome information. Based on the framework protocol of fault tolerant and error correction decoding provided in this disclosure, a suitable neural network classifier may be freely selected according to an actual situation to complete fault tolerant and error correction decoding.

For ease of the following introduction, an optimal decoding algorithm if syndromes are perfect is first introduced herein. As an error correction code, after an error occurs, error syndromes can be obtained through parity check. A position in which the error occurs and an error class are determined according to the error syndromes by using a specific decoding algorithm for error correction codes. In other words, a decoding process may be equivalent to that: an error occurrence model (a probability distribution of errors occurring on qubits) and syndromes obtained by a single perfect syndrome measurement are given, and an error that most possibly occur is deduced. For error syndromes without noise, a maximum a posterior (MAP) algorithm exists, which is also an optimal algorithm. The MAP algorithm is a departure point of the fault tolerant and error correction decoding framework provided in this disclosure.

S is defined as a stabilizer group of a QEC code [[n,k,d,]], and L is defined as a normalizer subclass of S in an n-qubit Pauli group. For any Pauli error E that occurs, the Pauli error E is split into:

$$E=L(E)T(S(E));$$

where $L(E) \in L$ belongs to a normalizer subclass L, and is a function of E, S(E) is a syndrome of the error E, and is an error mapped according to the error syndrome, the mapping generating an error set, which is in a one-to-one correspondence with a syndrome set; T(S(E)) is referred to as simple decoding, and elements in the error set are referred to as simple errors. Selection of T(S(E)) has great arbitrariness. For another error E', if E and E' have the same error syndrome, $$E'=L(E')T(S(E')=S(E)).$$

Provided that L(E') and L(E) belongs to the same normalizer subclass L, the two errors only differ by one element in a stabilizer group. That is, functions of the two errors for an encoding space are equivalent. E' may be selected for correcting E (that is, an error that actual occurs is E, but because E and E' are equivalent, error correction may be actually performed according to E', and the same effect is obtained. For a topological QEC code represented by a surface code, different normalizer subclasses L represent different topological homology classes to which operators belong. For topological error correction codes, terms such as "homology class" or "error class" is used for representing a normalizer subclass in the following. Errors belonging to a homology class do not generate any error syndromes (error syndromes are all 0), so that the class of errors and logic errors are equivalent. The reason is that a cause of a homology class error is mathematically a logic error. When the logic error occurs in an encoding space, results of syndrome measurement on the logic error are all 0.

In this way, an error E that occurs is given, then a deduction process of a MAP decoder may be expressed as:

$$\tilde{L} = \arg\max\nolimits_L \sum_{l \in L} Pr(lT(s(E))).$$

That is, after simple errors are removed, only which normalizer subclass to which an error most possibly belongs needs to determined, and then an error that needs to be corrected can be obtained by selecting any element in this class and multiplying the element by an output error of a simple decoder. For a surface code, three classes corresponding to the normalizer subclass is three operators X, Y, and Z of logical qubits and a set of operators equivalent to the operators X, Y, and Z. An effective solution (which approximates the optimal solution) can be provided by using a neural network classifier with high performance. After a homology class $\tilde{L}$ is estimated with very high accuracy, because the error syndromes are perfect, a simple error T(S(E)) can be obtained immediately, and is multiplied by any element $\tilde{L}_r$ in $\tilde{L}$ to obtain an error that needs to be corrected:

$$\tilde{E}=\tilde{L}_r T(S(E)) \quad \text{(the formula is recorded as "Formula 1").}$$

Figure 5:
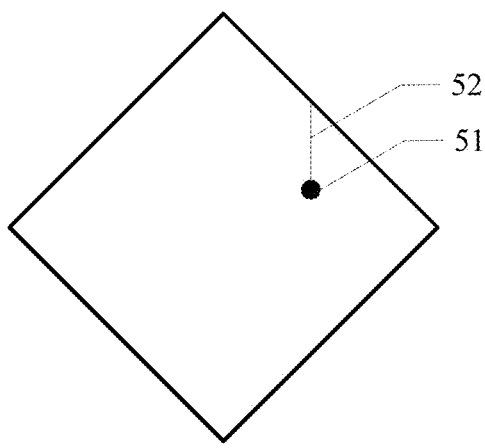
FIG. 5 is a schematic diagram of a simple error corresponding to a single syndrome point according to an embodiment of this disclosure.

Compared with a general error correction code, both an error and syndromes of the surface code have geometric significance. For the surface code, if an error of an error correction process is not considered, error syndrome information can be regarded as a two-dimensional array image including 0 and 1. For the surface code, error correction is to determine a position in which the error occurs and an error class based on positions of the syndromes. For ease of writing below, a type of simple decoders with geometric significance are introduced herein, which are referred to as "minimum boundary distance" decoders. Parity check operators of the surface code respectively detect X errors and Z errors. Because the two classes of errors are symmetrical, only one of them is considered. It is assumed that the Z errors are considered. For a rotated surface code, any syndrome bit having a value of 1 is considered as being generated by one X operator chain (error chain), and the chain connects a syndrome point to either of two boundaries. A chain with a shortest distance to the boundary in the chains is selected, and a simple error corresponding to the syndrome point is recorded. FIG. 5 is a schematic diagram of a simple error corresponding to a single syndrome point. In FIG. 5, a black dot 51 represents a single syndrome bit having a value of 1, and a straight line 52 represents an X-type simple error chain. The error chain is a shortest distance connecting the syndrome point to a boundary. For a rotated surface code of L×L, for X errors, $(L^2-1)/2$ syndromes having a value of 1 need to be decoded by using a "minimum boundary distance" decoder, and simple errors corresponding to the syndromes are recorded as:

$$\{E_\alpha | \alpha=1, \ldots (L^2-1)/2\}$$

Then when syndromes $\{S_1, \ldots S_{(L^2-1)/2}\}$, $(S_\alpha=0,1)$ are measured, a decoding input of a simple decoder is defined as $E_S = \Pi_\alpha E_\alpha^{S_\alpha}$, that is, a product of all simple errors having a syndrome bit of 1. Similarly, for Z errors, $(L^2-1)/2$ syndromes having a value of 1 also need to be decoded by using a "minimum boundary distance" decoder, and simple errors corresponding to the syndromes are recorded. Finally, a mapping table containing $(L^2-1)$ sets of mapping relationships is constructed, and each set of mapping relationship includes a mapping relationship between one error syndrome point and one simple error. Simple decoding processes may be performed in parallel, and in an actual situation, time complexity may be O(1).

For QEC in an actual scenario, all syndrome measurement circuits for stabilizer generators may be interfered by noise.

Figure 6:
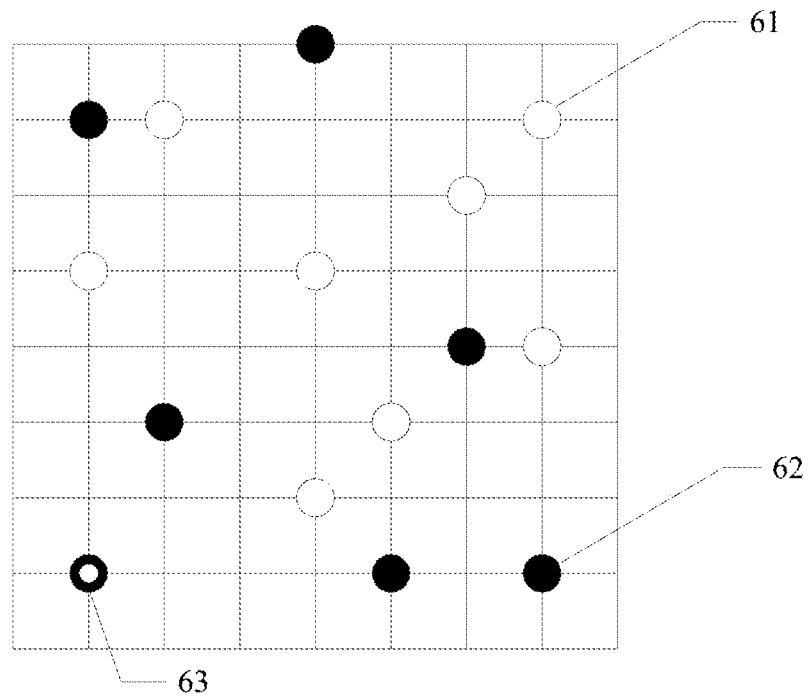
FIG. 6 is a schematic diagram of an error syndrome distribution in a case that a syndrome measurement circuit contains noise according to an embodiment of this disclosure.

FIG. 6 is a schematic diagram of an error syndrome distribution when a syndrome measurement circuit contains noise. In FIG. 6, a white point 61 represents an error syndrome having a measurement value of 1 and is correctly measured, and a black point 62 represents an error syndrome having a measurement value of 1 and is mistakenly measured. A black point 63 with white in the center at a lower left corner represents that 1 shall be measured, but consequently, 0 is measured. Even if there is only one incorrect syndrome point, a disastrous consequence will be caused. Performing decoding and error correction according to an incorrect syndrome point causes a large quantity of errors, consequently immediately going beyond an error correction capability of an error correction code. Therefore, a result of any syndrome measurement cannot be relied on. Correspondingly to this, a plurality of syndrome measurements need to be performed. To ensure effectiveness of fault tolerance and error correction, error syndrome information of T=O(L) measurements is collected; and a class and a position of an error that occurs are deduced together by using the syndromes, and error correction is performed.

Figure 7:
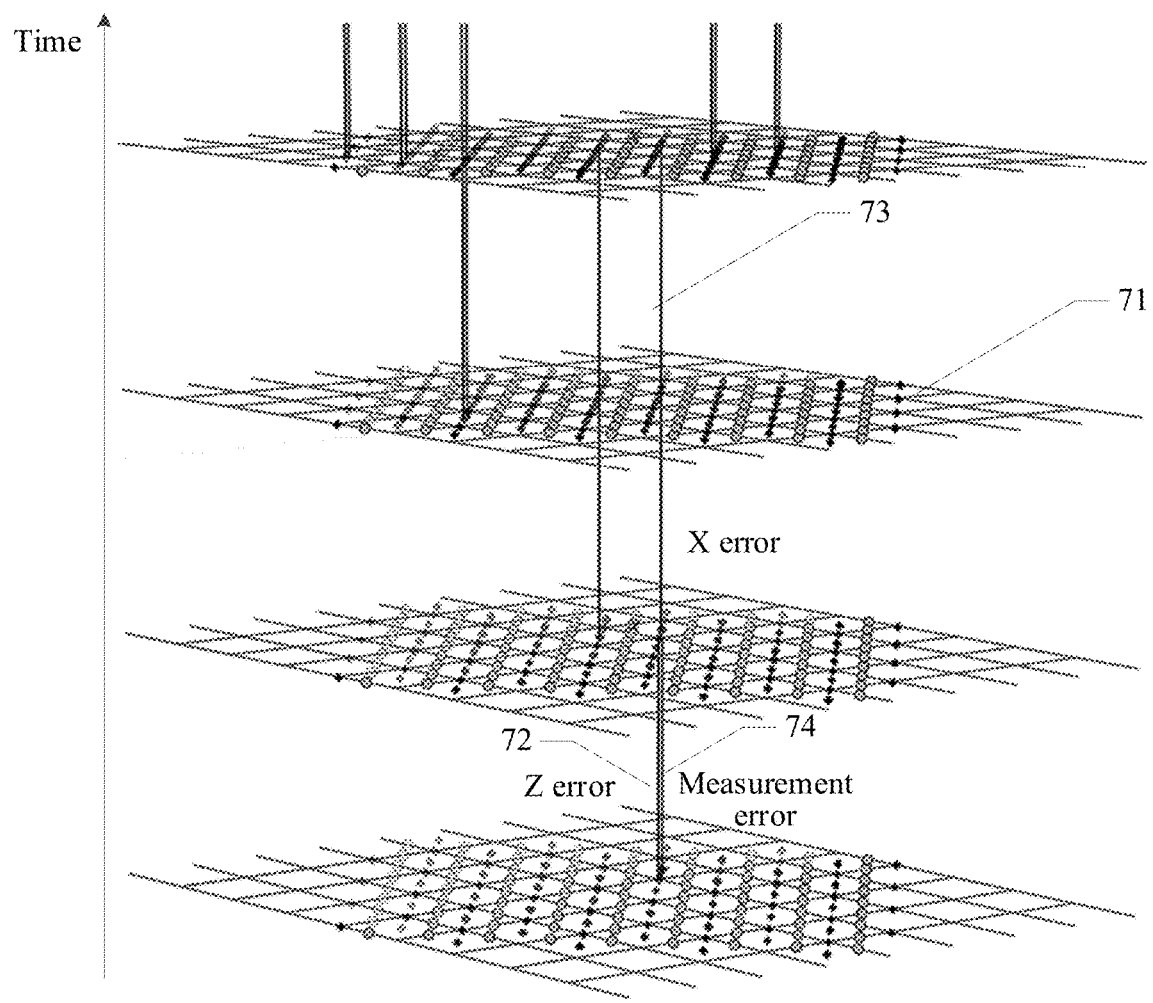
FIG. 7 is a schematic diagram of a three-dimensional syndrome distribution according to an embodiment of this disclosure.

FIG. 7 is a schematic diagram of a three-dimensional syndrome distribution, where the longitudinal direction represents time. It can be regarded as a three-dimensional data array including 0 and 1. Four slices 71 are included in FIG. 7 in total, and each splice 71 represents error syndrome information obtained through one measurement. A line 72 represents syndromes caused by a Z error, a line 73 represents syndromes caused by an X error, and a line 74 represents a measurement error.

Figure 8:
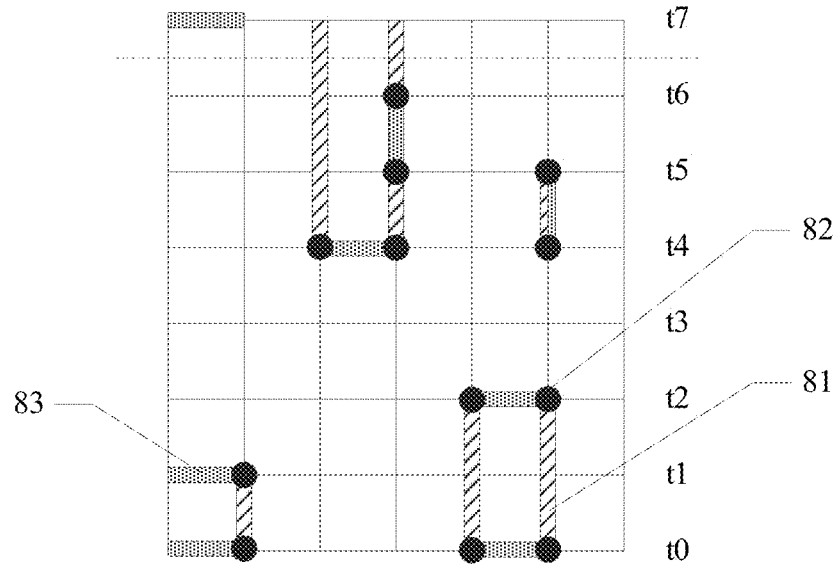
FIG. 8 is a schematic diagram of mapping of errors on spatiotemporal lattices according to an embodiment of this disclosure.

In a fault tolerant case, any distribution of spatiotemporal errors may be finally equivalent to a group of equivalent data errors that occur at a time point $t_i$, and equivalent measurement errors that occur between a time point $t_j$ and a time point $t_{j+1}$. As shown in FIG. 8, syndrome points having a value of 1 form chains (line segments 81 with slashes shown in FIG. 8) in a three-dimensional space. If a minimum weight perfect matching (MWPM) connection is performed by taking end points 82 of the line segments, an error chain formed through the connection can be used for simultaneously locating a measurement error and data qubit errors that occur at different time, making a summary, and performing error correction. As shown in FIG. 8, line segments 83 with points connected to end points 82 represent errors that occur. A line segment 83 with points in a horizontal direction represents a data error, and a line segment 83 with points in a vertical direction represents a measurement error. Works of an MWPM decoder consumes a relatively long time, and even the works are fully parallelized, time complexity of $O(L^6)$ is still required. However, when FTQC is performed, a quantum circuit changes an error class in real time, and errors occurring in different time and space cannot be correctly tracked and located based on only syndrome information. To enable QC to be proceeded smoothly, decoding needs to be performed immediately after error syndromes are obtained, and error correction needs to be completed before each computation step of a quantum algorithm is performed (or before a next round of error correction starts), which is referred to as real-time error correction. The real-time error correction poses high rigid requirements on a runtime margin of a decoding algorithm for QEC codes, but the MWPM decoder cannot meet requirements for real-time error correction.

An attempt is made to use a neural network decoder to perform QEC decoding. The neural network decoder is good at classifying logic error classes (homology classes). The following problems are introduced herein:

1. Before a round of T=O(L) syndrome measurements is performed, all errors that occur before need to be removed as much as possible. In this way, error syndrome information obtained through the round of T=O(L) syndrome measurements only relies on a remaining localization error from a last time and space, an error of data qubits that occurs in this time and space, and an error measurement on auxiliary qubits.

2. A classification to be performed needs to be determined. When error syndrome information is perfect, a homology class to which an error remaining after simple errors are removed from actual errors belongs needs to be determined, that is, to perform classification according to syndromes. In a fault tolerant and error correction case, errors occur in different time periods, but what actually affects a quantum state is an accumulation of actual data errors in a final time, that is, a total error before error correction occurs. FIG. 8 is used as an example. A totality of projections of all errors at a time point $t_7$ is concerned about, so that a natural selection is to classify, according to all syndromes, all errors occurring on data qubits and remaining at the time point $t_7$.

3. Final determination of an error position. According to Formula 1, even if a homology class to which an error in a final time is determined, a reliable error syndrome is still required for actual decoding. Once a syndrome point used has a wrong value, a corresponding error chain is used for the wrong syndrome point value. Because all error chains are nonlocal (which increase along with increasing of L), so that for any incorrect syndrome bit, after error correction, not only an error that actually occurs cannot be corrected, but also a large quantity of errors are caused. These errors quickly accumulate. In a worst situation, after a round of such error correction, an accumulation quantity of errors has gone beyond an error correction capability of a surface code with a large probability. Such an error correction process cannot correct an error, but damage a stored quantum state more quickly.

4. A totality of projections of different bit-measurement error spatiotemporal distributions at the time point $t_7$ may generate the same syndrome distribution, even if only limited localizations differ between the errors. The final errors may have completely different homology classes and syndromes, but three-dimensional error syndrome distributions generated by the final errors are the same. In this way, a randomly generated error cannot be used for being directly projected to a final time and then a homology class is extracted to correspond to error syndrome data (the same piece of input training data corresponds to a plurality of pieces of different labels).

Based on the foregoing analysis, the following conclusion can be obtained:

1. When classification information is mapped to an error that specifically occurs, it cannot rely on unreliable syndromes at a single time point, but needs to rely on syndromes of the entire $O(L^3)$ time and space.

2. Even if three-dimensional syndromes are used, this problem still cannot be transformed into a simple homology class classification problem.

Obviously, this cannot be described by using Formula 1, and a new method needs to be provided to resolve the foregoing problem.

Figure 9:
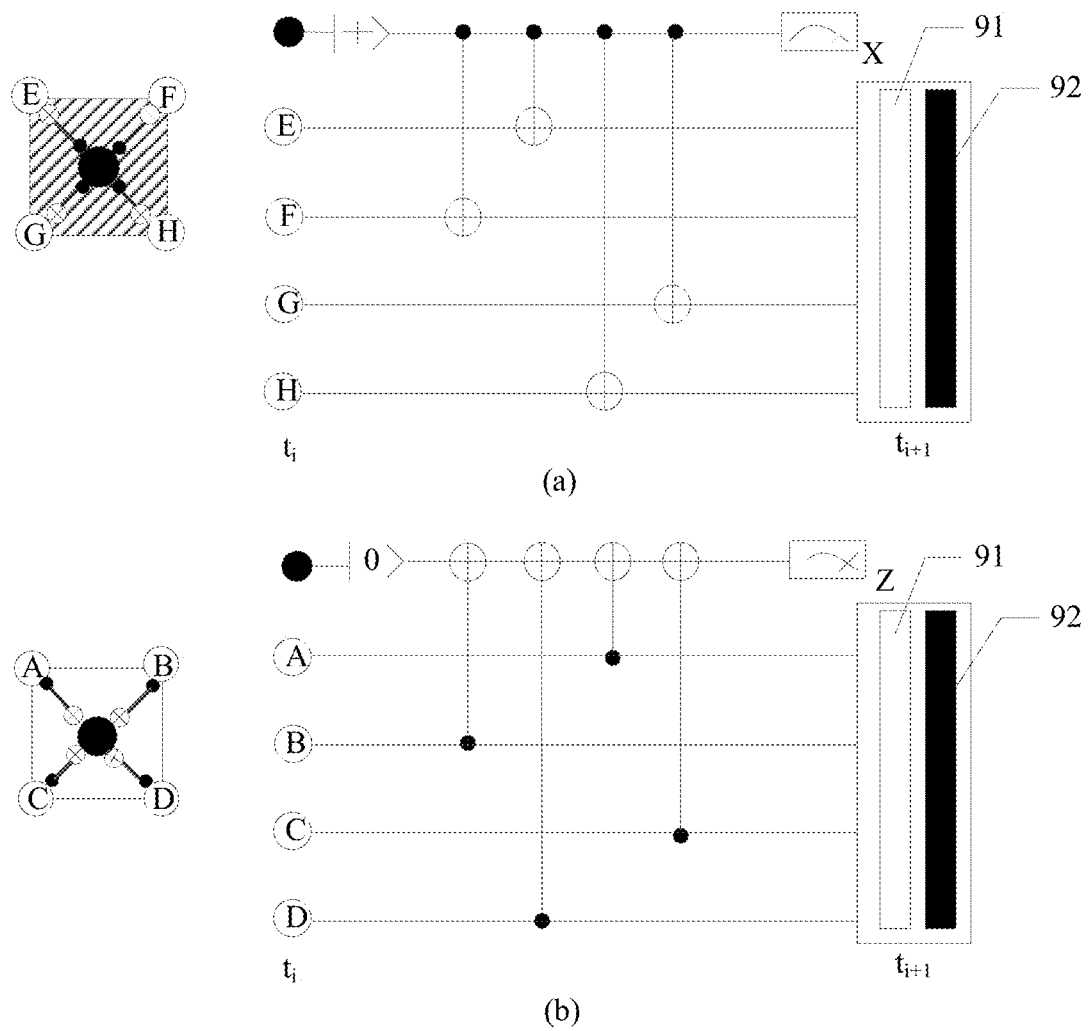
FIG. 9 is a schematic diagram of an error syndrome measurement circuit according to an embodiment of this disclosure.

First, a relationship between errors and syndromes of all classes in time and space is observed. For example, syndrome measurement circuits for two classes of errors are respectively shown in FIG. 9. The part (a) in FIG. 9 shows a syndrome measurement circuit that detects Z errors, and the part (b) in FIG. 9 shows a syndrome measurement circuit that detects X errors. The two type of circuits are fixed, where time of any element in the circuits and a corresponding bit sequence cannot be reversed.

All elements in the circuit, including preparation of auxiliary states $|0\rangle$ and $|+\rangle$, controlled-not (CNOT), storage of qubits, and an error syndrome measurement are interfered by noise (which are respectively defined as a state preparation error, a quantum gate error, an internal memory error, and a measurement error). For brevity of analysis, all noise such as the CNOT, the preparation of auxiliary states, and the measurement on auxiliary states are equivalently propagated to right ends of the circuits (the parts represented by white rectangles 91 in FIG. 9). For the circuit shown in the part (a) in FIG. 9, the type of noise can only generate an equivalent Z error in auxiliary qubits; similarly, for the circuit shown in the part (b) in FIG. 9, the type of noise can only generate an equivalent X error in auxiliary qubits (this is caused by special layouts of the circuits shown in FIG. 9). Because the circuits shown in FIG. 9 are used, for an X measurement, an X error has no influence; only a Z error actually generates an influence. Similarly, for a Z measurement, a Z error has no influence, and only an X error actually generates an influence. Simultaneously, the equivalent errors and the internal memory error (the parts represented by black rectangles 92 in FIG. 9) are combined to form an equivalent data error. The equivalent error is on data qubits of a measurement circuit with noise. The internal memory error is on data qubits before a next round of measurement. In other words, syndrome values between time layers $t_i$ and $t_{i+1}$ may be considered as a common result between a corresponding equivalent data error and a corresponding equivalent measurement error. When the equivalent data error occurs at $t_i$, the equivalent measurement error is a measurement error for auxiliary qubits that occurs between $t_i$ and $t_{i+1}$. In this way, spatiotemporal lattices shown in FIG. 8 may be used for representing all errors and a syndrome history.

The following describes that only classifying homology classes corresponding to actual error symptom information cannot be used for performing FTQEC, and describes that homology classes corresponding to the actual error symptom information cannot be used for labelling training data. For example, still only X errors are considered, and discussion on Z errors is the same. The spatiotemporal lattices shown in FIG. 8 are used as an example. After the round of syndrome measurement between $t_6$ and $t_7$ is completed, a history of all syndromes can be obtained, to represent information about all classes of errors from $t_0$ to $t_6$. As seen in the following, if an error correction process is completely correct, an influence of all equivalent errors occurring on data qubits in this period can be removed in principle. However, there are no corresponding syndromes for representing equivalent data errors occurring at $t_7$, so that the equivalent data errors are retained to a subsequent error correction step (the errors are generated by independent noise that naturally occurs, and therefore are not nonlocal errors, and do not damage the fault tolerance). Similarly, equivalent errors occurring at $t_0$ may also be considered as local errors remaining from a last round of $O(L)$ time error correction (other errors are all corrected through the last round of error correction process). In other words, errors and corresponding spatiotemporal lattices on the syndrome diagram that are selected each time are a semi-open set (which is open for a boundary in a positive direction of time).

Figure 10:
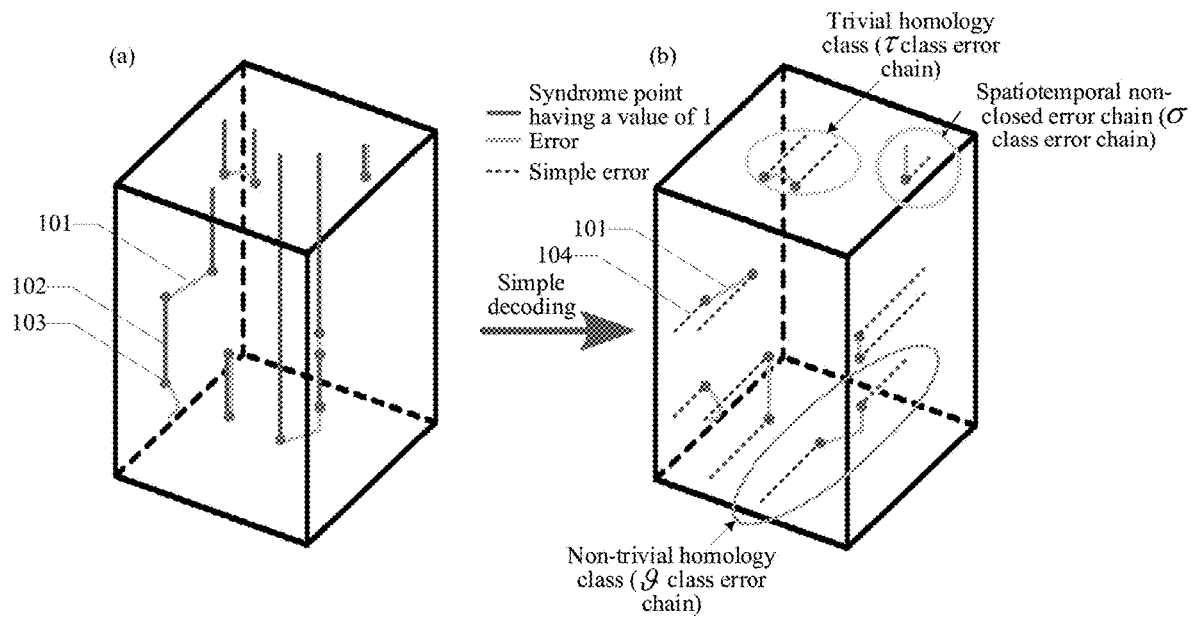
FIG. 10 is a schematic diagram of a homology class determination according to an embodiment of this disclosure.

It can be found that a final accumulation of all equivalent data errors ED that occur in an entire semi-open set spatiotemporal manifold actually needs to be corrected, that is, a projection for the final time. Once all equivalent errors (for example, gray lines 101 in FIG. 10) in time and space are given, all syndromes are determined (no matter whether reflect an equivalent error occurring on actual data qubits). These syndromes are also what can be experimentally measured (black lines 102 in the part (a) in FIG. 10). First, simple error correction is performed by imitating a case in which syndromes are perfect: taking end points (black end points 103 in FIG. 10) of the syndromes in time and space, then for each end point in a spatiotemporal lattice and within a time layer to which the spatiotemporal lattice belongs, using the end point as a syndrome point having a value of 1 for running a "minimum boundary distance correction" algorithm to obtain a simple error (a dashed line 104 in the part (b) in FIG. 10), and defining all obtained simple errors as $E_S$ in a combination manner. The gray lines 101 and the dashed lines 104 in FIG. 10 share syndrome points 103, to form various classes of error chains, which are classified into three classes herein for discussion:

1. A starting point and an endpoint of each error chain formed by the gray line 101 and the dashed line 104 have the same spatial boundary, and in this case, the error chain is referred to belonging to a trivial homology class (or a "0" class). A set of this class of error chains is defined as $\tau$, and all errors acting on data qubits in the class of error chains are defined as $E_{\tau,D}$.

2. An error chain formed by the gray line 101 and the dashed line 104 communicates with another boundary from a boundary of one space, to form a topological non-trivial homology class. A set of the class of error chains is defined as ϑ, and all errors acting on data qubits in the class of error chains are defined as $E_{\vartheta,D}$.

3. For an error chain formed by the gray line 101 and the dashed line 104, one end ends up on a positive boundary of time in a spatiotemporal lattice, and the other end ends up on a spatial boundary. The class of error chains may be referred to as "spatiotemporal non-closed error chains", and a set of the class of error chains is defined as σ. All errors acting on data qubits in the class of error chains are defined as $E_{\sigma,D}$, and the σ herein contains all chains on which equivalent measurement errors may occur before the final time because of the existence of the σ class of error chains (the class of errors exist for any simple decoder). So that after simple error correction, fault tolerant and error correction decoding cannot be incorporated into a simple three-dimensional homology class classification problem, because the $E_{\sigma,D}$ chain is not a spatiotemporal closed chain. Therefore, a homology class in space may be computed after the $E_{\sigma,D}$ chain is removed.

Because a spatiotemporal error diagram is semi-open for a positive direction of time, measurement errors (an error chain of a σ class is caused after simple decoding) that occur before a final time greatly increases complexity of the problem. Main problems herein are as follows:

1. Generated errors of different homology classes may generate same syndromes. For example, a same syndrome before the final time may be caused by an equivalent measurement error, or may be caused by an equivalent data error. These different errors belong to different homology classes. If training data is generated by randomly generating errors, homology classes are computed, and the data is used as labels corresponding to inputted three-dimensional syndromes. Each syndrome corresponds to various different labels (and a probability that a syndrome corresponding to each label occurs is at one order of magnitude). In this way, the data cannot be used for training a neural network model to learn classification on homology classes.

2. If classification is performed by forcibly using data of a randomly generated error, a homology class and a perfect error syndrome of the error need to be simultaneously used, which include $L^2$ parameters in total; and the $L^2$ parameters are fixed for particular input syndromes. There are $2^{(L^2)}$ such potential different labels. Obviously, using so many labels is impractical.

3. In addition, a perfect syndrome of a final error is further required. Similar to the homology class, different final errors have different perfect syndromes, but may generate the same three-dimensional syndrome. Therefore, finally the neural network model cannot be trained to learn final error syndrome information that are concerned about.

If it is assumed that the error syndrome information measured at a final time point is perfect error syndrome information and that a training dataset for a neural network decoder is generated based on the perfect error syndrome information, an inconsistency problem of data labels no longer exists. This approach has some properness: if only quantum state storage is performed, a position and a class of an error in data qubits do not need to be known in real time. It can be assumed that the error syndrome information is perfect when the state is finally read. However, this type of neural network decoder obtained through training cannot process a real-time error correction decoding problem in QC (because in QC, before some steps, a position in which the error occurs and an error class need to be known immediately and the error needs to be corrected), and cannot be actually used in QC.

Figure 11:
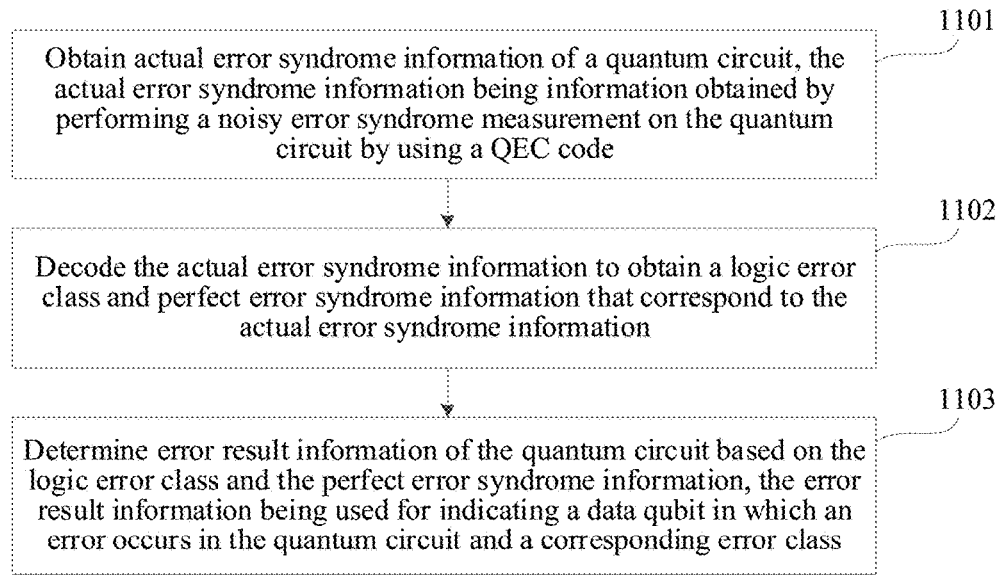
FIG. 11 is a flowchart of a fault tolerant and error correction decoding method for a quantum circuit according to an embodiment of this disclosure.

FIG. 11 is a flowchart of a fault tolerant and error correction decoding method for a quantum circuit according to an embodiment of this disclosure. An example in which the method is applied to the control device in the application scenario shown in FIG. 3 is used. The method may include the following steps.

Step 1101: Obtain actual error syndrome information of a quantum circuit, the actual error syndrome information being information obtained by performing a noisy error syndrome measurement on the quantum circuit by using a QEC code.

By performing an error syndrome measurement on the quantum circuit by using a QEC code, corresponding error syndrome information can be obtained. The error syndrome information is a data array formed by eigenvalues of stabilizer generators of the QEC code. Exemplarily, the error syndrome information is a two-dimensional or three-dimensional data array consisting of 0s and 1s. For example, when there is no error, the eigenvalues of the stabilizer generators are 0; when an error occurs, eigenvalues of some stabilizer generators are 1. In an actual scenario, an error syndrome measurement performed on the quantum circuit by using the QEC code contains noise, that is, a measurement error exists. Therefore, the actual error syndrome information herein refers to error syndrome information with noise that is measured in an actual scenario.

Figure 12:
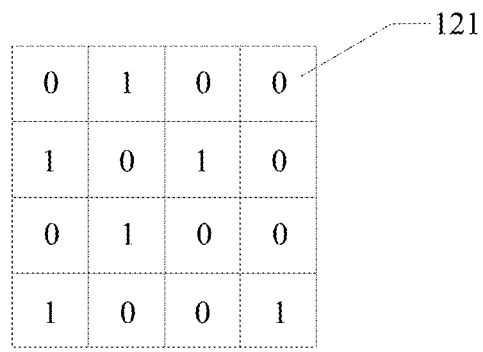
FIG. 12 is a schematic diagram of a two-dimensional data array of error syndrome information according to an embodiment of this disclosure.

An example in which the QEC code is a surface code is used. For a surface code, an error and an error syndrome have specific spatial positions: when an error causes a syndrome, an eigenvalue of an auxiliary qubit in a corresponding position is 1; on the other hand, when there is no error, the eigenvalue of the auxiliary qubit in the corresponding position is 0. Therefore, for the surface code, if an error of the error correction process is not considered (that is, the measurement process is perfect), the error syndrome information can be considered as a two-dimensional data array consisting of 0s and 1s. For example, FIG. 12 is a schematic diagram of a two-dimensional data array 121 of error syndrome information, where 0 indicates that there is no error, and 1 indicates that an error exists.

Figure 13:
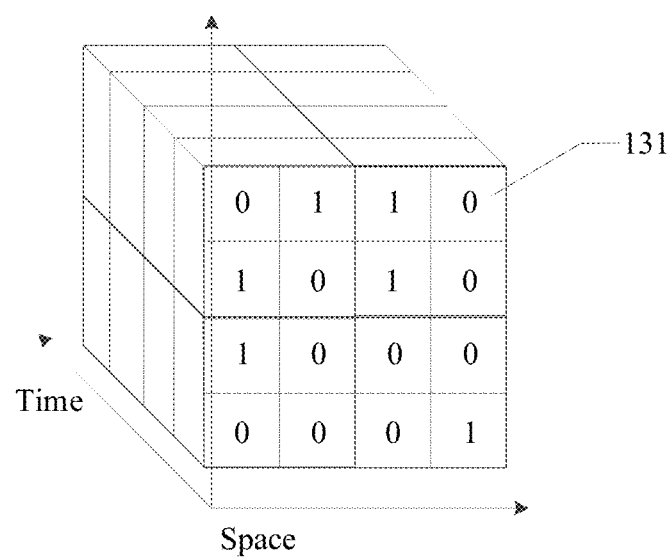
FIG. 13 is a schematic diagram of a three-dimensional data array of error syndrome information according to an embodiment of this disclosure.

In addition, to ensure effectiveness of fault tolerance and error correction, the obtained actual error syndrome information may include T data arrays, where each data array is obtained by performing a noisy error syndrome measurement on the quantum circuit by using the QEC code, and T is an integer greater than 1. As described above, T=O(L), where L is a scale of the QEC code. In this way, actual error syndrome information obtained through each error syndrome measurement may be a two-dimensional data array of (L+1)×(L+1) (to facilitate machine learning, a syndrome boundary at each time point is appropriately expanded), and actual error syndrome information obtained through T error syndrome measurements can form a three-dimensional data array of (L+1)×(L+1)×T. For example, FIG. 13 is a schematic diagram of a three-dimensional data array 131 of error syndrome information, where 0 indicates that there is no error, and 1 indicates that an error exists.

Step 1102: Decode the actual error syndrome information to obtain a logic error class and perfect error syndrome information that correspond to the actual error syndrome information.

Logic error classes are classes obtained through mapping of errors occurring in the quantum circuit. The logic error classes may also be referred to as homology classes, which include the following four classes: I, X, Y, and Z. I indicates that there is no error, X represents an X error, Z represents a Z error, and Y indicates that there are both an X error and a Z error. Each logic error class includes at least one equivalent error element. Optionally, each logic error class includes a plurality of equivalent error elements. Elements in the logic error class I are elements in a stabilizer group. Elements in the logic error class X are an element set obtained by respectively multiplying a logic X operator by the elements in the stabilizer group. Elements in the logic error class Y are an element set obtained by respectively multiplying a logic Y operator by the elements in the stabilizer group. Elements in the logic error class Z are an element set obtained by respectively multiplying a logic Z operator by the elements in the stabilizer group. Elements belonging to the same logic error class are equivalent. For example, if an error E and another error E that actually occur belong to the same logic error class, then error correction on the error E is equivalent to error correction on the error E, i.e., the same effect can be achieved.

Figure 14:
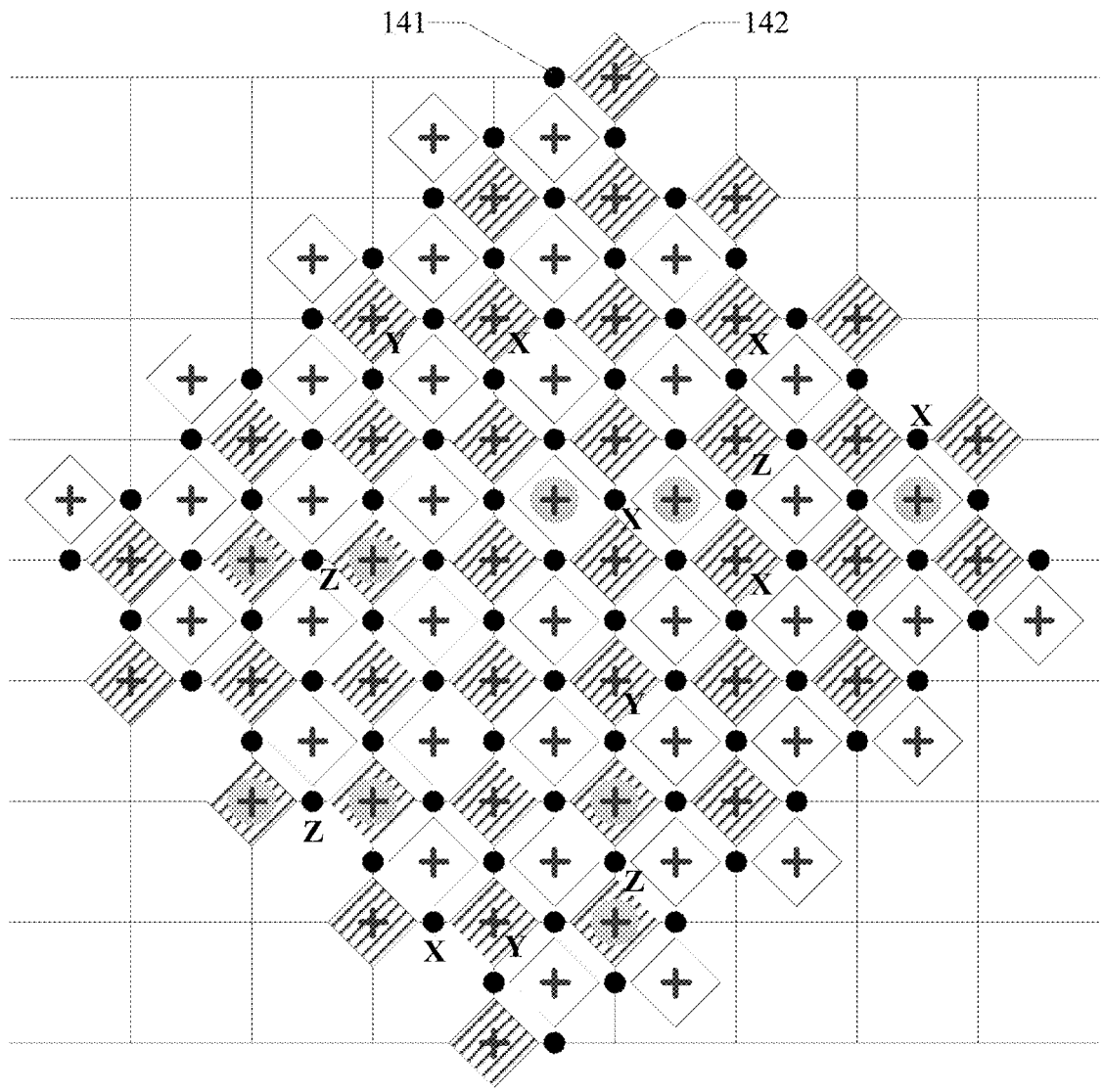
FIG. 14 is a schematic diagram of perfect error syndrome information according to an embodiment of this disclosure.

The perfect error syndrome information is information obtained by performing a noise-free error syndrome measurement on the quantum circuit. In this embodiment of this disclosure, to decode the actual error syndrome information, not only a corresponding logic error class needs to be obtained, but also corresponding perfect error syndrome information needs to be obtained. Only in this way can error result information of the quantum circuit be finally determined according to Formula 1 described above. For example, FIG. 14 is a schematic diagram of perfect error syndrome information. In FIG. 14, black dots 141 represent data qubits, and crosses 142 represent auxiliary qubits. Errors occurring on the auxiliary qubits have no impact on the perfect syndrome measurement, and errors are marked in the figure with X, Y, and Z.

In addition, the actual error syndrome information may be decoded by using a neural network decoder, or by using any other suitable decoder, which is not limited in the embodiments of this disclosure. The neural network decoder is a machine learning model that is constructed based on a neural network and configured to decode error syndrome information. If a neural network decoder is used to decode the actual error syndrome information, input data of the neural network decoder includes the actual error syndrome information, and output data of the neural network decoder includes a logic error class and perfect error syndrome information that correspond to the actual error syndrome information. In addition, a neural network decoder configured to obtain the logic error class through decoding and a neural network decoder configured to obtain the perfect error syndrome information through decoding are the same or different neural network decoders.

Figure 15:
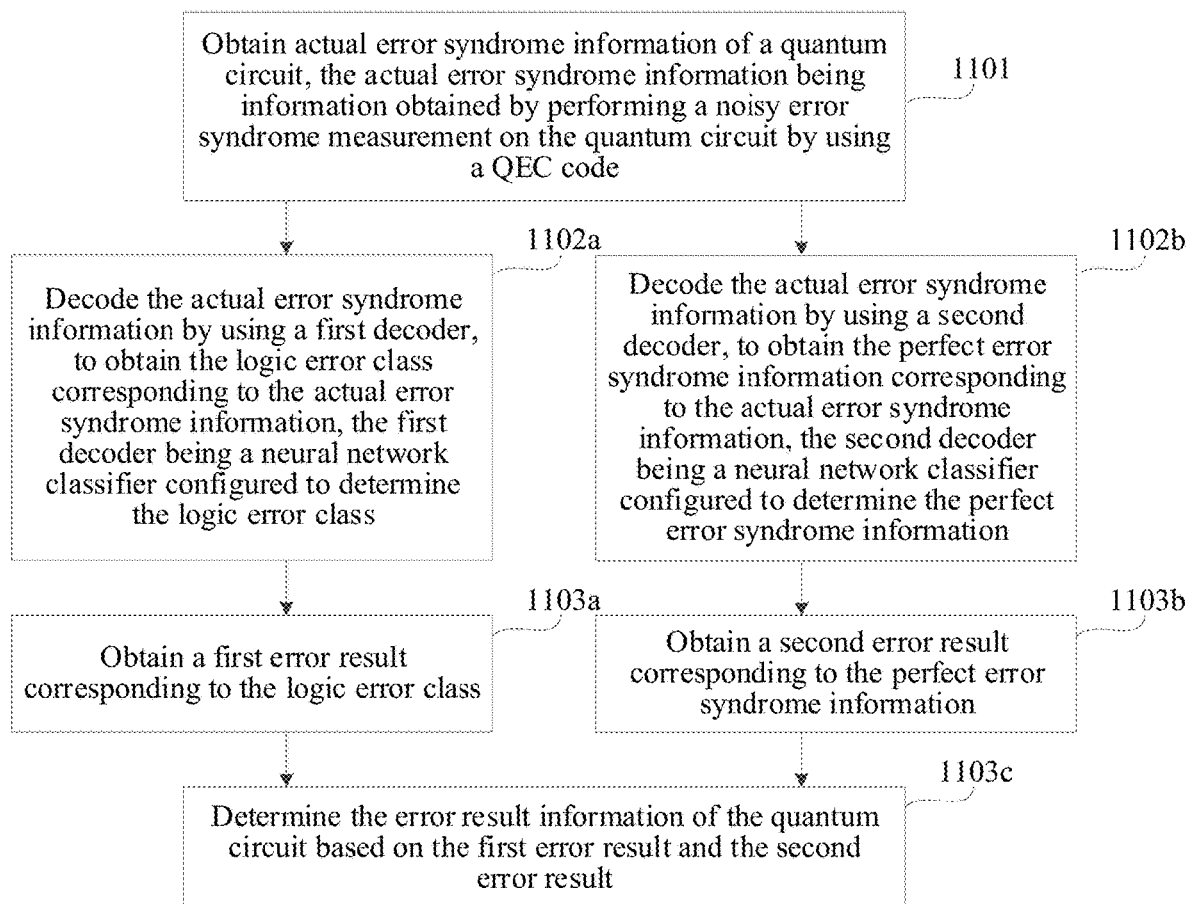
FIG. 15 is a flowchart of a fault tolerant and error correction decoding method for a quantum circuit according to another embodiment of this disclosure.

In an exemplary embodiment, as shown in FIG. 15, step 1102 may be replaced and implemented by the following steps 1102a and 1102b:

Step 1102a: Decode the actual error syndrome information by using a first decoder, to obtain the logic error class corresponding to the actual error syndrome information, the first decoder being a neural network classifier configured to determine the logic error class.

In this embodiment of this disclosure, the logic error class corresponding to the actual error syndrome information is predicted by using a trained first decoder. In some embodiments, the number of first decoders is 1, and the first decoder is a four-class classification model. An output of the first decoder includes four logic error classes, namely, I, X, Y, and Z. The first decoder may be a classification model constructed based on a fully connected network, a CNN, an RNN, or other neural networks, which is not limited in the embodiments of this disclosure.

In some embodiments, the actual error syndrome information is partitioned by using the first decoder to obtain at least two blocks; feature extraction is performed on the at least two blocks in parallel by using at least two feature extraction units to obtain feature information; fusion decoding is performed on the feature information by using the first decoder to obtain the logic error class corresponding to the actual error syndrome information.

Step 1102b: Decode the actual error syndrome information by using a second decoder to obtain the perfect error syndrome information corresponding to the actual error syndrome information, the second decoder being a neural network classifier configured to determine the perfect error syndrome information.

In this embodiment of this disclosure, the perfect error syndrome information corresponding to the actual error syndrome information is predicted by using a trained second decoder. In some embodiments, the number of second decoders is one or more. Optionally, the number of second decoders is k, where k is a positive integer and is related to the scale of the QEC code. Assuming that the QEC code is a stabilizer code with a scale of L, the number of second decoders is $k=L^2-1$. In this case, the second decoder may be a binary classification model, an output of which includes two error syndrome values that need to be classified, that is, 0 and 1, where 0 indicates that there is no error, and 1 indicates that there is an error.

The foregoing steps 1102a and 1102b may be performed in sequence or in parallel, and parallel execution of the two steps helps shorten the time required for executing the processes. To achieve real-time fault tolerant and error correction decoding, as many devices and suitable communicative connections as possible shall be selected to complete parallel execution.

Figure 16:
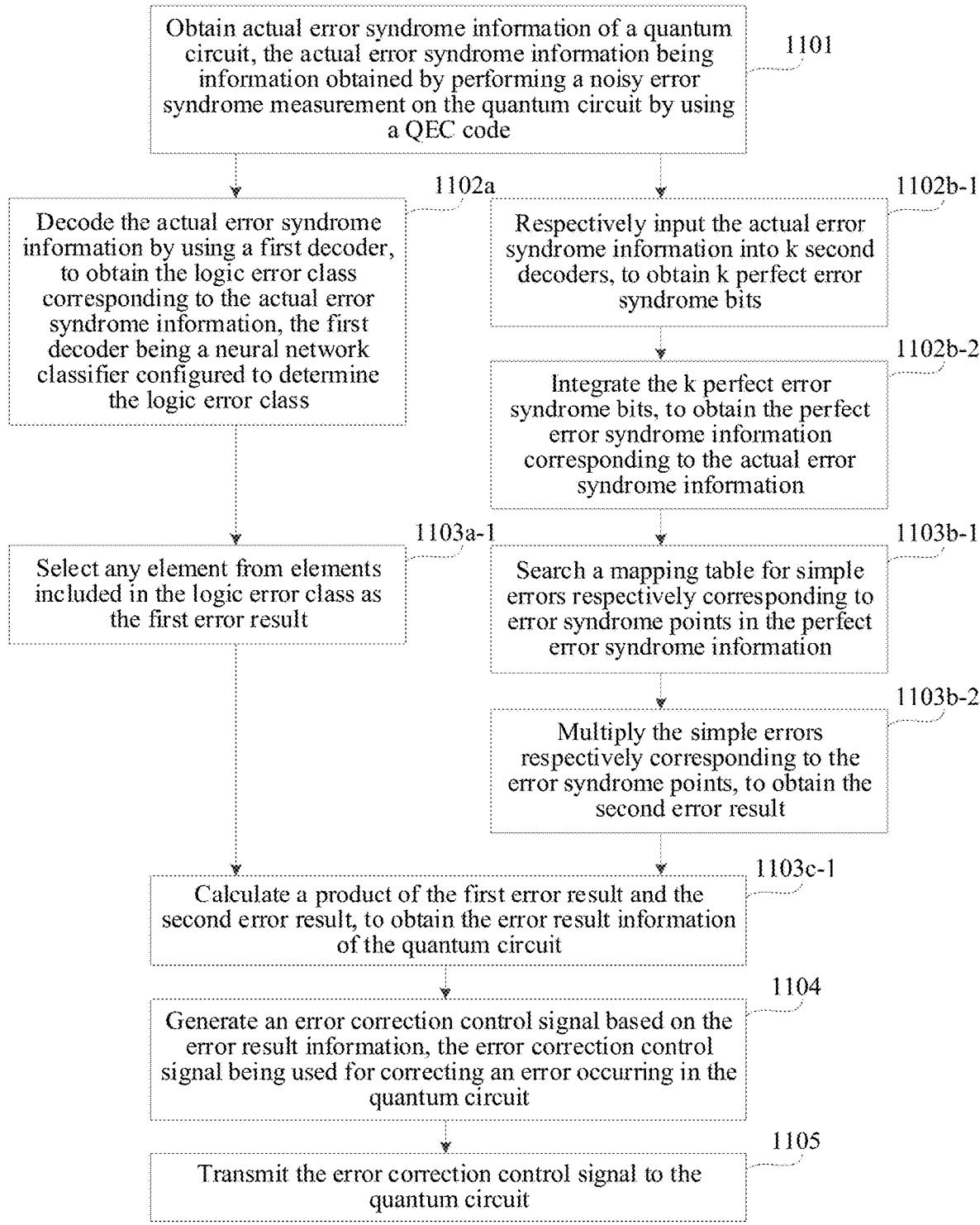
FIG. 16 is a flowchart of a fault tolerant and error correction decoding method for a quantum circuit according to another embodiment of this disclosure.

In an exemplary embodiment, as shown in FIG. 16, step 1102b may be replaced and implemented by the following steps:

Step 1102b-1: Respectively input the actual error syndrome information into k second decoders, to obtain k perfect error syndrome bits.

Step 1102b-2: Integrate the k perfect error syndrome bits, to obtain the perfect error syndrome information corresponding to the actual error syndrome information.

Each second decoder is configured to output a perfect error syndrome bit in one syndrome measurement position. By integrating output results of the k second decoders, perfect error syndrome bits in all syndrome measurement positions, that is, the perfect error syndrome information corresponding to the actual error syndrome information, can be obtained.

Figure 17:
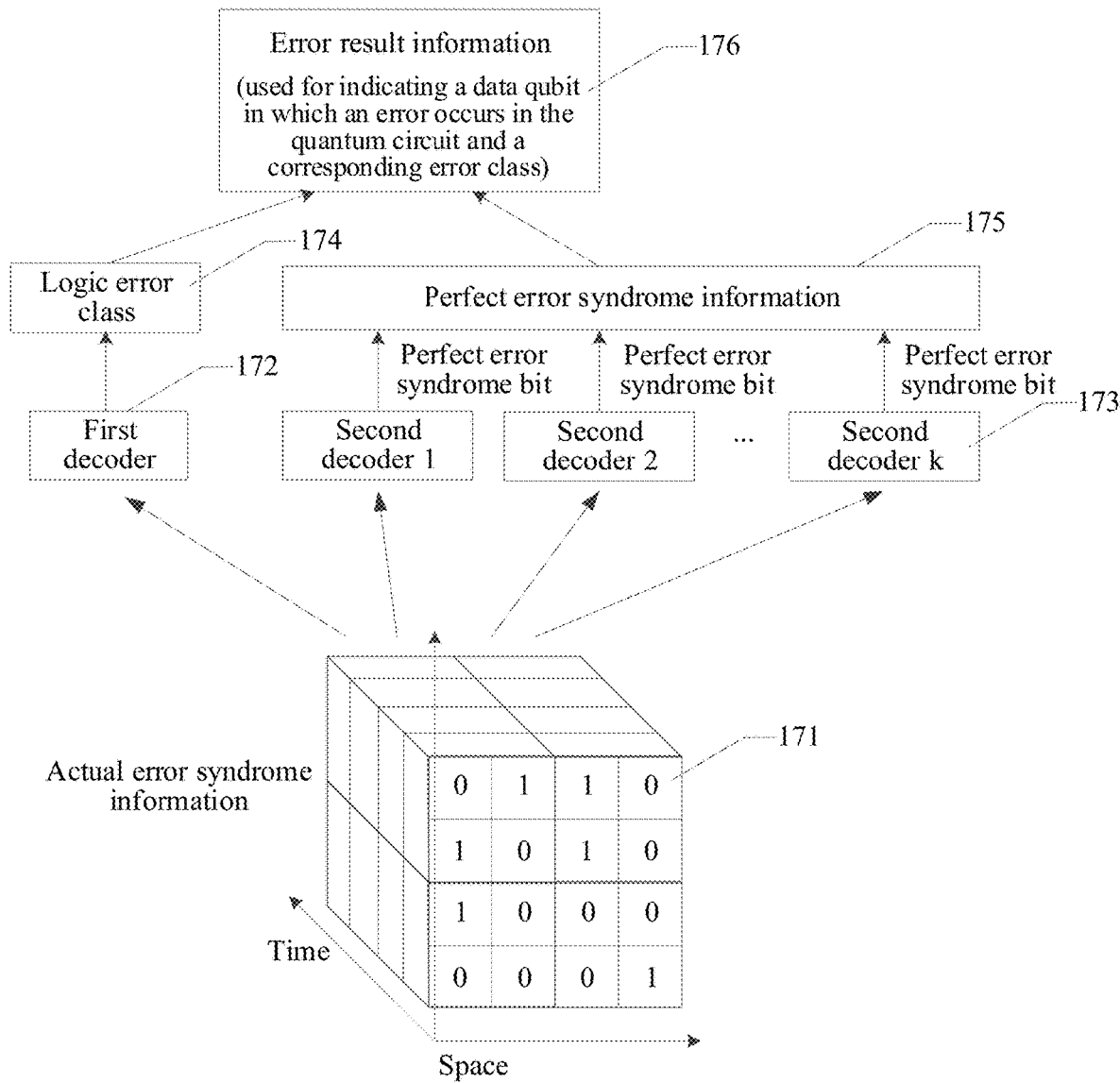
FIG. 17 is a schematic diagram of a fault tolerant and error correction decoding process according to an embodiment of this disclosure.

As shown in FIG. 17, a three-dimensional data array 171 corresponding to the actual error syndrome information is respectively inputted into a first decoder 172 and second decoders 173; the first decoder 172 outputs a logic error class 174 corresponding to the actual error syndrome information; the second decoders 173 output perfect error syndrome bits; the perfect error syndrome bits outputted by the second decoders 173 are integrated to obtain perfect error syndrome information 175 corresponding to the actual error syndrome information; finally error result information 176 of the quantum circuit is determined according to the logic error class 174 and the perfect error syndrome information 175.

In addition, the second decoder may be a classification model constructed based on a fully connected network, a CNN, an RNN, or other neural networks, which is not limited in the embodiments of this disclosure.

The model structures of the first decoder and the second decoders may be the same or different, and the depths of the models need to be as consistent as possible to achieve maximum parallelization.

Step 1103: Determine error result information of the quantum circuit based on the logic error class and the perfect error syndrome information, the error result information being used for indicating a data qubit in which an error occurs in the quantum circuit and a corresponding error class.

With reference to Formula 1 described above, after the logic error class and the perfect error syndrome information are obtained, corresponding simple errors may be determined according to the perfect error syndrome information. Then, by multiplying the simple errors by any element in the logic error class, an error that needs to be corrected, that is, error result information of the quantum circuit, can be obtained.

The data qubit, in which the error occurs in the quantum circuit and the corresponding error class, can be determined based on the error result information of the quantum circuit. For example, a position of the data qubit in which the error occurs in the quantum circuit is determined, and the error class of the data qubit in which the error occurs in the position is determined. For example, it is determined whether the error is an X error, a Z error, or a Y error.

In an exemplary embodiment, as shown in FIG. 15, step 1103 may be replaced and implemented by the following steps 1103a, 1103b, and 1103c:

Step 1103a: Obtain a first error result corresponding to the logic error class.

In an exemplary embodiment, as shown in FIG. 16, step 1103a may be replaced and implemented by the foregoing step: step 1103a-1: select any element from elements included in the logic error class as the first error result, the logic error class including at least one equivalent error element.

For example, if the logic error class corresponding to the actual error syndrome information obtained through decoding is X, any element is selected from error elements included in the logic error class X as the first error result.

Step 1103b: Obtain a second error result corresponding to the perfect error syndrome information.

After the perfect error syndrome information corresponding to the actual error syndrome information is obtained through decoding, the second error result corresponding to the perfect error syndrome information may be obtained by using a simple decoder.

In an exemplary embodiment, as shown in FIG. 16, step 1103b may be replaced and implemented by the foregoing steps: step 1103b-1: search a mapping table for simple errors respectively corresponding to error syndrome points in the perfect error syndrome information, the mapping table including at least one set of mapping relationship between an error syndrome point and a simple error; step 1103b-2: multiply the simple errors respectively corresponding to the error syndrome points, to obtain the second error result.

Step 1103c: Determine the error result information of the quantum circuit based on the first error result and the second error result.

In an exemplary embodiment, as shown in FIG. 16, step 1103c may be replaced and implemented by the foregoing step: step 1103c-1: determine a product of the first error result and the second error result, to obtain the error result information of the quantum circuit.

An error reversely derived from the logic error class in the foregoing manner is an equivalent error that occurs on a data qubit. The derived error may not be the same as an error that originally occurs, but has the same effect (or a difference between the errors is local).

In addition, the foregoing steps 1103a and 1103b may be performed in sequence or in parallel, and parallel execution of the two steps helps shorten the time required for executing the processes.

Exemplarily, as shown in FIG. 16, after the error result information of the quantum circuit is determined, the following steps may be further performed:

Step 1104: Generate an error correction control signal based on the error result information, the error correction control signal being used for correcting an error occurring in the quantum circuit.

Step 1105: Transmit the error correction control signal to the quantum circuit.

Exemplarily, the error correction control signal may be a microwave control signal, an electronic control signal, or a control signal in any other form, which is not limited in the embodiments of this disclosure. The error correction control signal is transmitted to the quantum circuit, so that the quantum circuit corrects, based on the error correction control signal, a data qubit error that occurs on the quantum circuit, to achieve an objective of real-time error correction.

Based on the above, in the technical solution provided in this embodiment of this disclosure, by decoding actual error symptom information of a quantum circuit to obtain a corresponding logic error class and corresponding perfect error syndrome information and then determining a data qubit in which an error occurs in the quantum circuit and a corresponding error class according to the logic error class and the perfect error syndrome information, this disclosure achieves fault tolerant and error correction decoding on error syndrome information of the quantum circuit if the error syndrome information is not perfect.

In addition, this solution equivalently transforms fault tolerant and error correction decoding into a classification problem, so that fault tolerant and error correction decoding can be performed on error syndrome information by using an efficient neural network classifier, thereby improving the fault tolerant and error correction decoding speed, and achieving real-time fault tolerant and error correction decoding. If a suitable neural network classifier is selected, the speed of the decoding algorithm can be greatly improved, thereby paving the way for implementation of real-time fault tolerant and error correction decoding.

The foregoing embodiments provide a framework for performing fault tolerant and error correction decoding by using a neural network. A training process of the first decoder and the second decoder is described below.

Since randomly generated errors (an internal memory error, a state preparation error, a quantum gate error, a measurement error, and the like) cannot be used for generating samples suitable for training, a mapping is required. The mapping makes three-dimensional error syndrome information correspond one-to-one to an error (that is, each sample). This error does not need to be completely equivalent to a final mapping of an actual error, provided that a difference between this error and any final error that generates a three-dimensional syndrome distribution is local. Being Local means that if there are n differences between an error obtained through a mapping and the actual error, a probability that the class of differences occur is $O(p^n)$, where p is approximately a probability that each class of physical errors occur. In this way, each piece of three-dimensional error syndrome information corresponds to only one determined error, that is, a uniquely determined logic error class and uniquely determined perfect error syndromes. In addition, computation time for obtaining the error is required to be acceptable (which at least cannot be increased with an L exponent), because the class of mappings also need to be invoked to label data during training.

A mapping that naturally meeting these conditions is, for example, using a fault tolerant decoding algorithm such as a three-dimensional spatial MWPM algorithm or a deep reinforcement learning algorithm. The class of algorithms provide a spatiotemporal distribution of data errors and measurement errors. An estimated error obtained through a mapping is projected at a final time point, and then a logic error class corresponding to the estimated final error and perfect error syndromes corresponding to the estimated final error can be computed. All of these are training labels, and then a neural network model is set for the logic error class and each obtained perfect error syndrome bit. A surface code having a scale of L is used as an example, and there may be one logic error class and $L^2-1$ perfect error syndrome bits. Therefore, a model (that is, the first decoder described above) is bound for learning of the logic error class, and then $L^2-1$ models (that is, the second decoders described above, for example, binding a model $M_{i,j}$ for a perfect error syndrome bit having coordinates of (i, j)) are respectively bound for the $L^2-1$ syndromes. In this way, $L^2$ models in total need to be trained.

With reference to the descriptions above, a training dataset of a model may be generated in a simulation manner, or may be obtained by collecting actual experiment data.

Figure 18:
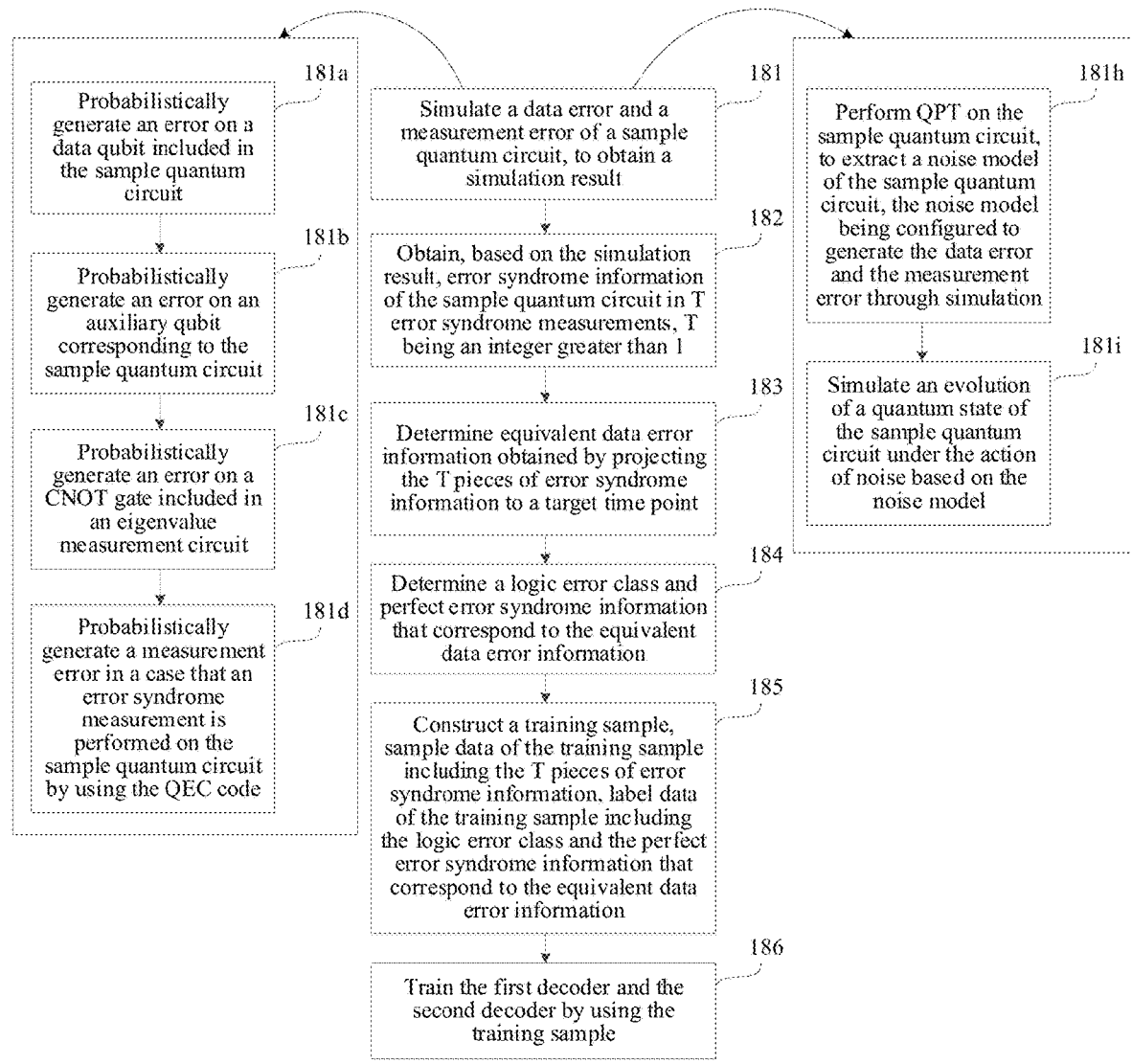
FIG. 18 is a flowchart of a training data generation process according to an embodiment of this disclosure.

In a possible implementation, a training dataset is generated in a simulation manner. As shown in FIG. 18, the process may include the following steps:

Step 181: Simulate a data error and a measurement error of a sample quantum circuit, to obtain a simulation result.

The data error is an error occurring on a data qubit of the sample quantum circuit, and the measurement error is an error occurring during an error syndrome measurement. The data error is an internal memory error described above. The measurement errors may include a state preparation error, a quantum gate error, and a measurement error described above.

Step 182: Obtain, based on the simulation result, error syndrome information of the sample quantum circuit in T error syndrome measurements, T being an integer greater than 1.

T error syndrome measurements are performed on the sample quantum circuit, to obtain T pieces of error syndrome information. For the surface code having a scale of L, obtained results of two classes of parity checks are combined into one two-dimensional T×(L+1)×(L+1) array including 0 and 1.

Step 183: Determine equivalent data error information obtained by projecting the T pieces of error syndrome information to a target time point.

Positions of equivalent data error information and equivalent measurement error information are different in time and space. As shown in FIG. 8, the equivalent data error information is a horizontal line, and the equivalent measurement error information is a vertical line, so that by projecting the error syndrome information at a target time point, the equivalent data error information can be easy to be extracted from equivalent error information.

Step 184: Determine a logic error class and perfect error syndrome information that correspond to the equivalent data error information.

Step 185: Construct a training sample, sample data of the training sample including the T pieces of error syndrome information, and label data of the training sample including the logic error class and the perfect error syndrome information that correspond to the equivalent data error information.

Step 186: Train the first decoder and the second decoder by using the training sample.

In an embodiment, as shown in FIG. 18, step 181 may include the following sub-steps 181a to 181d:

Sub-step 181a: Probabilistically generate an error on a data qubit included in the sample quantum circuit. For example, for each data qubit, an X error, a Y error, or a Z error (internal memory noise) is generated on each qubit with a probability p before a parity check begins. For example, an X error, a Y error, or a Z error is generated on each data qubit of the sample quantum circuit with the probability p, and a standard random number generation method may be specifically used, to evenly sample a random number from [0,1]. If the random number falls within [0, p/3], it is set to an X error; if the random number falls within [p/3, 2p/3], it is set to a Y error; if the random number falls within [2p/3, p], it is set to a Z error; and if the random number falls within [p, 1], it is set to I (that is, there is no error).

Sub-step 181b: Probabilistically generate an error on an auxiliary qubit corresponding to the sample quantum circuit, the auxiliary qubit being configured to measure the error syndrome information of the sample quantum circuit. For example, for an auxiliary qubit prepared on $|0\rangle$ (or $|+\rangle$)), an X error or a Z error (state preparation noise) is generated with a probability p.

Sub-step 181c: Probabilistically generate an error on a CNOT gate included in an eigenvalue measurement circuit, the eigenvalue measurement circuit being corresponding to the sample quantum circuit, and being configured to measure an eigenvalue of a stabilizer generator. For example, for each CNOT in an eigenvalue measurement circuit, one error (quantum gate noise) in 15 double Pauli operators (including IX, IY, IZ, XI, YI, ZI, XX, XY, XZ, YX, YY, YZ, ZX, ZY, and ZZ) is generated with the probability p.

Sub-step 181d: Probabilistically generate a measurement error when an error syndrome measurement is performed on the sample quantum circuit by using the QEC code. For example, an X(Z) error (measurement noise) occurs before a Z(X) measurement with the probability p, where Z(X) indicates that only an X error affects a Z measurement, and X(Z) indicates that only a Z error affects an X measurement.

However, such a noise model is over-desirable. In another possible implementation, quantum process tomography (QPT) may be first experimentally performed on qubits, to extract an actual noise model. This manner is equivalent to ignoring noise associations among more than three qubits. If the associations are very strong, the associations first need to be experimentally removed, because they cause a fatal impact to QEC. After the QPT is completed, an impact of actual physical noise on a quantum state may be directly simulated according to the QPT by using a Monte Carlo method, and then a desirable parity check is performed and syndromes and error homology classes are extracted to obtain label data. Because the QPT consumes too much resources, the QPT is merely acted on two geometrically neighboring qubits at most. A disadvantage of this approach is that a surface code having a large scale (for example, a surface code having a L greater than 10) cannot be simulated, because this requires full quantum simulation, which has relatively high computation complexity.

In another example, as shown in FIG. 18, step 181 may include the following sub-steps 181h to 181i:

Sub-step 181h: Perform QPT on the sample quantum circuit, to extract a noise model of the sample quantum circuit, the noise model being configured to generate the data error and the measurement error through simulation.

Sub-step 181i: Simulate an evolution of a quantum state of the sample quantum circuit under the action of noise based on the noise model.

If this manner is used, QPT may be first experimentally performed on qubits to extract accurate mathematical description of internal memory noise, state preparation noise, quantum gate noise, and measurement noise, and then syndromes and labels are generated after directly simulating an evolution of a quantum state under the action of noise.

The foregoing describes generation of a training dataset in a simulation manner. For the first training data generation manner, training data is generated by performing error imitation by using a desirable noise model; and for the second training data generation manner, an actual noise model is extracted through QPT, and then the actual noise model is used for simulating an impact of actual physical noise on the sample quantum circuit to generate training data.

Figure 19:
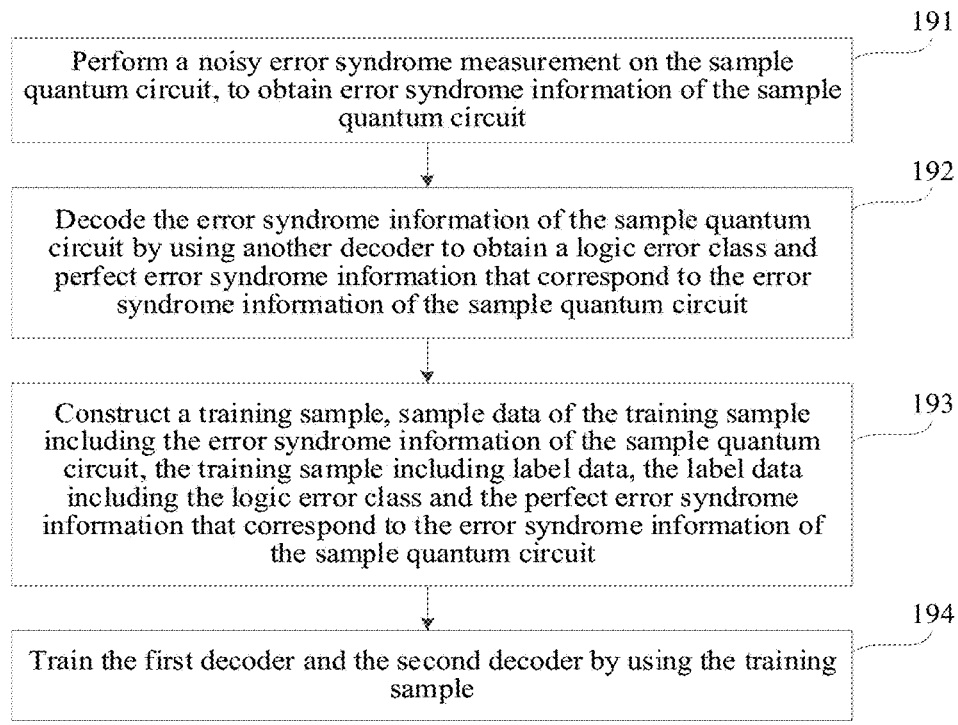
FIG. 19 is a flowchart of a training data generation process according to another embodiment of this disclosure.

In another possible implementation, a training dataset is obtained by collecting actual experimental data. As shown in FIG. 19, the process may include the following steps (191 to 194):

Step 191: Perform a noisy error syndrome measurement on the sample quantum circuit, to obtain error syndrome information of the sample quantum circuit.

Step 192: Decode the error syndrome information of the sample quantum circuit by using another decoder to obtain a logic error class and perfect error syndrome information that correspond to the error syndrome information of the sample quantum circuit.

Step 193: Construct a training sample, sample data of the training sample including the error syndrome information of the sample quantum circuit, the training sample including label data, the label data including the logic error class and the perfect error syndrome information that correspond to the error syndrome information of the sample quantum circuit.

Step 194: Train the first decoder and the second decoder by using the training sample.

The other decoder may be any decoder having a QEC decoding capability. In an example, the other decoder may be a deep reinforcement learning decoder. The deep reinforcement learning decoder uses an unsupervised training manner, so that the deep reinforcement learning decoder may be trained by collecting actual experimental data to enable the deep reinforcement learning decoder to learn relationships between the actual error syndrome information and the corresponding logic error class and the corresponding perfect error syndrome information. Then sample data can be generated according to the actual error syndrome information by using the deep reinforcement learning decoder on which training has completed.

In addition, the training of the neural network decoder is in a standard neural network training manner. Exemplarily, a cross entropy is used as a target function, and a stochastic gradient decent algorithm is used for training. Generally, using an adaptive moment estimation algorithm can obtain better performance. There may be 1 million to 30 million training samples, a learning rate falls within a range from 1e-5 to 1e-2, and a learning momentum is taken from 1e-4 to 1e-6. It is found through experiments that with the foregoing hyperparameter settings, a relatively satisfactory training result can be obtained under pytorch 1.2.

The foregoing describes several manners of generating a training dataset. The use of the simulation manner is simpler and more efficient, and the use of the manner of collecting actual experimental data consumes a relatively long time due to a requirement for reinforcement learning, but sample data generated in this manner is closer to practice and more realistic. In actual application, a training dataset may be generated by selecting a suitable manner according to an actual requirement, which is not limited in the embodiments of this disclosure.

In an exemplary embodiment, when neural network decoders (including the first decoder and the second decoder described above) performs feature extraction on error syndrome information, a divide-and-rule idea and a partitioning-based feature extraction manner are used. The partitioning-based feature extraction means that, when extracting feature information, a feature extraction layer of the neural network decoder partitions input data, to divided the input data into a plurality of small blocks, and separately performs feature extraction on the small blocks. That is, the partitioning-based feature extraction means that after the input data is partitioned to obtain at least two blocks, feature extraction is performed on the at least two blocks in parallel by using at least two feature extraction units. The at least two blocks correspond one-to-one to the at least two feature extraction units, and each feature extraction unit is configured to perform feature extraction on one block. In addition, the at least two blocks perform feature extraction in parallel, which helps shorten time required by feature extraction.

For example, considering a case in which perfect error syndromes can be obtained, effectiveness of a model can be checked in this case. Because a decoding problem may be equivalent to a classification problem, it may be attempted to use a conventional neural network to classify different inputted error syndromes. A simplest approach is to use a fully connected network, which includes an input layer, intermediate hidden layers, and an output layer. The output layer only includes four homology classes (I, X, Y, and Z) that need to be classified. Such a network becomes larger with a scale of a surface code that needs to be decoded, a quantity of contained parameters exponentially increases, and training difficulty (required datasets and a required convergence speed) also exponentially increases. To deal with this situation, this disclosure proposes to use the divide-and-rule idea and a partitioning-based feature extraction manner. That is, a large surface code is split into small blocks, and the small blocks are "classified" (the "classified" herein means extracting feature information); then the classified information (probabilities of classes) is transmitted to a previous layer; and then the previous layer determines, according to the information transmitted from the next layer and equivalent error syndromes in the previous layer, probabilities that the error classes occur in the layer. Recursion is performed in this way, until probabilities of error classes of the entire surface code are finally summarized, and then classification and error correction are performed. In an exemplary embodiment, when the first decoder decodes the actual error syndrome information to obtain the corresponding logic error class, a partitioning-based feature extraction manner may be used:

1. Perform partitioning-based feature extraction on the actual error syndrome information by using the first decoder, to obtain feature information.

2. Perform fusion decoding on the feature information by using the first decoder, to obtain the logic error class corresponding to the actual error syndrome information.

In an exemplary embodiment, when the second decoder decodes the actual error syndrome information to obtain the corresponding perfect error syndrome bits, a partitioning-based feature extraction manner may also be used:

1. Perform partitioning-based feature extraction on the actual error syndrome information by using the second decoder, to obtain feature information.

2. Perform fusion decoding on the feature information by using the second decoder, to obtain the perfect error syndrome bits.

In an exemplary embodiment, the neural network decoder (including the first decoder and the second decoder described above) includes m cascaded feature extraction layers, m being a positive integer. The feature extraction layer is a neural network layer configured for feature extraction. Steps of performing partitioning-based feature extraction on the actual error syndrome information may include: performing partitioning-based feature extraction on the actual error syndrome information by using the m feature extraction layers, to obtain feature information. A first feature extraction layer is configured to perform partitioning-based feature extraction on the actual error syndrome information, and an $i^{th}$ feature extraction layer is configured to perform partitioning-based feature extraction on a feature extraction result of a previous feature extraction layer, i being an integer greater than 1 and less than and equal to m.

Exemplarily, the neural network decoder further includes a plurality of cascaded feature fusion layers, the feature extraction layer being a neural network layer configured to perform fusion decoding on feature information extracted by a feature extraction layer.

Figure 20:
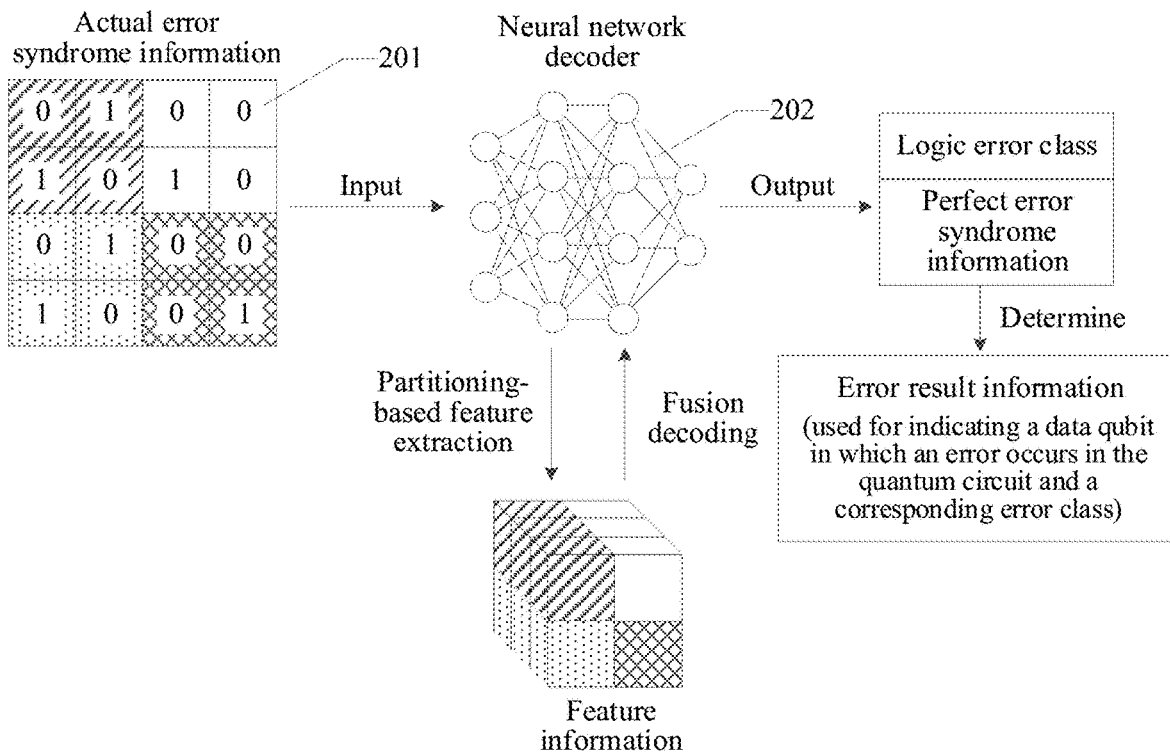
FIG. 20 is a schematic diagram of partitioning-based feature extraction according to an embodiment of this disclosure.

By using a CNN as an example, the feature extraction layer is a convolutional layer, and the feature fusion layer may be a fully connected layer. The neural network decoder includes an input layer, at least one convolutional layer, at least one fully connected layer, and an output layer. There are usually a plurality of convolutional layers, and there are also usually a plurality of fully connected layers. As shown in FIG. 20, error syndrome information 201 is divided into a plurality of data units. In FIG. 20, an example in which the error syndrome information is a data array of 4×4 is used, and the data array is divided into four data units (different data units are shown in FIG. 20 with different fillings), each data unit being a sub-array of 2×2. The error syndrome information 201 is inputted into a neural network decoder 202. For convolutional layers of the neural network decoder 202, a partitioning-based feature extraction manner is used, and different data units are simultaneously read by the same convolution kernel. If C features need to be read, C such convolution kernels are required. C is a quantity of channels corresponding to the convolutional layers. For a surface code having a scale of L, a scale of a sub-array corresponding to each convolution is l. In a first layer, a convolution kernel of l×l that is mapped from one channel to $C_1(L)$ channels is required, and in a second layer, a convolution kernel of l×l that is mapped from $C_1(L)$ channels to $C_2(L)$ channels is required. By analogy, log (L/l) layers of convolution in total are required. A quantity of the channels is a hyperparameter that needs to be adjusted, which increases with L. Finally, an array with a size about $O(C_{log(L/l)}(L))$ is outputted from a convolutional layer, and the array is inputted into a fully connected layer. Then when each fully connected layer is passed through, if $C_k(L) \sim O(L^2)$ is selected, a depth of the fully connected layer is about O(log L). In this way, even if a scale of a sub-array is relatively large, a model having a relatively small depth may alternatively be used, and the depth of the model gradually becomes P(log L). If $C_k(L) \sim O(L^2)$ is selected, a CNN from a $k^{th}$ layer to a $(k+1)^{th}$ layer includes $O(L^2)$ parameters, and a total quantity of parameters of all convolutional layers is $O(L^4 \log L)$. Similarly, a total quantity of parameters of all fully connected layers is also ($L^4$ log L). A different value may be selected as a size of the sub-array herein for each renormalization. This growth manner is obviously polynomial and non-exponential. That is, the solution shall be extensible.

An example in which the error syndrome information is a data array of 8×8 is used. The data array may be split into 16 sub-arrays of 2×2, and a convolution kernel size of a first convolutional layer is 2×2. Partitioning-based feature extraction is performed by using the first convolutional layer, and a feature data array of 4×4 can be obtained. The feature data array of 4×4 may be split into four sub-arrays of 2×2, and a convolution kernel size of a second convolutional layer is 2×2. Partitioning-based feature extraction is performed by using the second convolutional layer, and a feature data array of 2×2 can be obtained. When the error syndrome information or a feature data array is partitioned, sizes of sub-arrays obtained through division may be the same or different. If error rates of different qubits are different, different sizes bring advantages in principle, but it is easier to operate when the sizes are the same. Exemplarily, when a feature extraction layer performs partitioning-based feature extraction, there is no intersection between any two blocks. That is, for each layer of feature extraction, there is no communication between all sub-arrays, and there is no intersection of syndromes between regions on which convolution kernels act. Only when feature information of feature extraction layers is collected and summarized to a next layer can the information thereof be simultaneously processed and comprehensively utilized. Because the feature extraction herein unnecessarily corresponds to a specific qubit error probability, belief propagation does not need to be performed to make marginal probabilities aligned, which also simplifies an algorithm and may probably provide better performance.

For example, a description is made on the algorithm by using L=15 as an example. There are two layers of convolution in total: for the first layer of convolution, a convolution kernel of 4×4 may be used, to perform mapping from one channel to 500 channels; and a convolution kernel size of the second layer is 2×2, mapping is performed from 500 channels to 1000 channels, and in this case, there are 4000 neurons at the second layer. Then values of the 4000 neurons are classified by using a fully connected network: a first fully connected layer connects the 4000 neurons to 1024 neurons; a second fully connected layer connects the 1024 neurons to 512 neurons; a third fully connected layer connects the 512 neurons to 128 neurons; and a fourth fully connected layer connects the 128 neurons to four neurons (I, X, Y, and Z). A pytorch code of a specific network model may be as follows:

```
from torch import nn
class CNN_2D(nn.Module):
    def_init_(self, input_size, output_size=4):
        self.input_size=input_size
        super(CNN_2D, self)._init_( )
        self.conv1=nn.Conv2D(15, 500, stride=4, kernel
            _size=4, padding=0)
        self.relu1=nn.ReLU( )
        self.conv2=nn.Conv2D(500, 1000, stride=2, kernel
            _size=2, padding=0)
```

```
    self.relu2=nn.ReLU( )
    self.fc1=nn.Linear(1000*2*2, 1024)
    self.relu3=nn.ReLU( )
    self.fc2=nn.Linear(1024, 512)
    self.relu4=nn.ReLU( )
    self.fc3=nn.Linear(512, 128)
    self.relu5=nn.ReLU( )
    self.fc4=nn.Linear(128, 4)
  def forward(self, x):
    x=self.conv1(x)
    x=self.relu1(x)
    x=self.conv2(x)
    x=self.relu2(x)
    x=x.view(-1, 1000*2*2)
    x=self.c1(x)
    x=self.relu3(x)
    x=self.fc2(x)
    x=self.relu4(x)
    x=self.fc3(x)
    x=self.relu5(x)
    x=self.fc4(x)
```

It can be seen from the foregoing example that, there are only six layers of the entire neural network when a simple rectified linear unit (ReLU) layer is removed, thereby being a very shallow neural network.

In an exemplary embodiment, to ensure effectiveness of fault tolerance and error correction, the obtained error syndrome information includes T data arrays, and each data array is obtained by performing an error syndrome measurement on a target quantum circuit by using the QEC code, T being an integer greater than 1. Optionally, as described above, $T=O(L)$.

Figure 21:
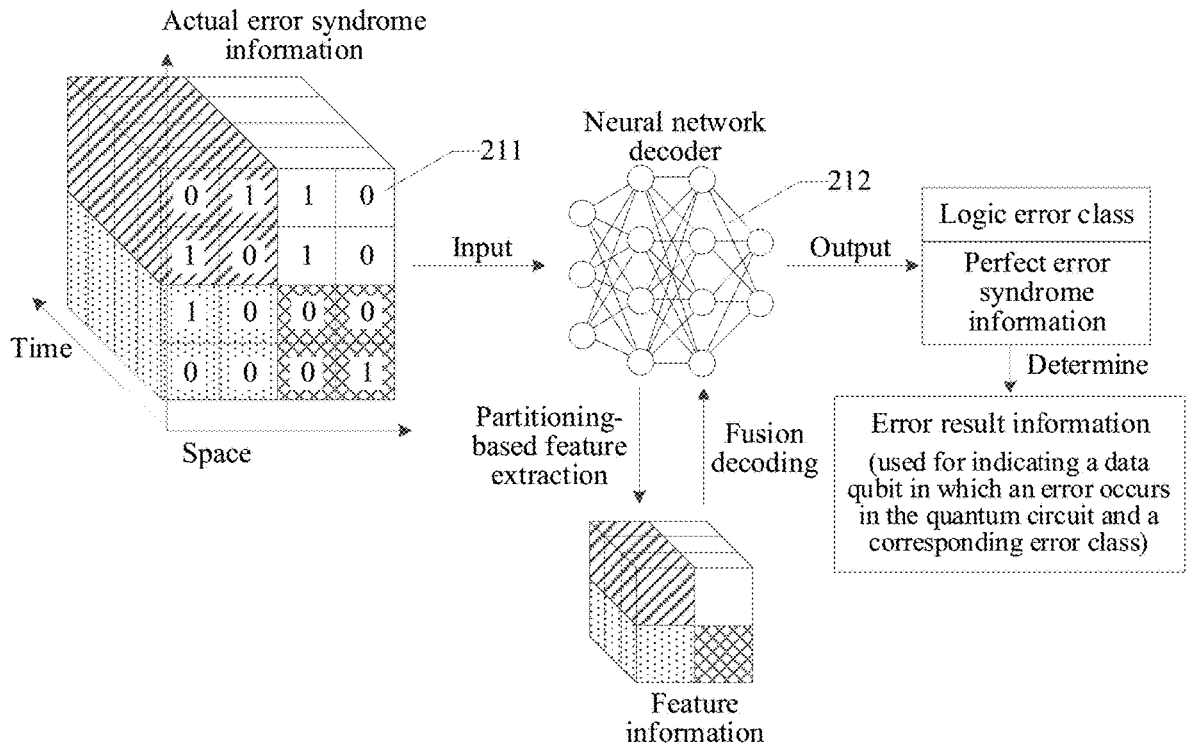
FIG. 21 is a schematic diagram of partitioning-based feature extraction according to another embodiment of this disclosure.

In this case, after the error syndrome information is obtained, the error syndrome information is divided into at least two data units, one data unit including T array units, that are located in the same positions, in T data arrays. A specific neural network algorithm is shown in FIG. 21, a structure there of is very similar to that in a case in which syndromes are perfect, but there is also a difference. As shown in FIG. 21, error syndrome information 211 is divided into a plurality of data units. In FIG. 21, an example in which the error syndrome information is a data array of 4×4×4 is used, and the data array is divided into four data units (different data units are shown in FIG. 21 with different fillings), each data unit being a sub-array of 2×2×4. The error syndrome information 211 is inputted into a neural network decoder 212. For a convolutional layer of the neural network decoder 212, feature information extraction is performed in a partitioning-based feature extraction manner. During real-time error correction, in addition to classification on homology classes, syndromes further need to be classified. To avoid repetition, only classification on homology classes is listed herein as an example. First, input channels of the first layer of the CNN change into T layers. In addition, a quantity of output channels of each of other layers of the CNN also increases from $O(L^2)$ to $O(L^3)$. In this way, finally, a depth of a decoder is still $O(\log L)$, and about $O(L^6 \log L)$ parameters are required. The selection of hardware for running the algorithm needs to fully consider whether there is sufficient space for storing the parameters and parallelizing each convolutional layer and each fully connected layer.

Based on the above, in the technical solution provided in this embodiment of this disclosure, partitioning-based feature extraction is performed on error syndrome information of a quantum circuit, to obtain a plurality of group of feature information; then fusion decoding is further performed on the plurality of group of feature information to obtain error result information. Because the partitioning-based feature extraction manner is used, compared with performing complete feature extraction on input data, on one hand, this technical solution causes a quantity of channels of feature information obtained through each feature extraction to decrease, so that input data of the next feature extraction is reduced, which help reduce a quantity of feature extraction layers in a neural network decoder, thereby shortening a depth of the neural network decoder. Because the depth of the neural network decoder is shortened, decoding time thereof is also correspondingly shortened.

On the other hand, during partitioning-based feature extraction, a plurality of feature extraction units are used for performing feature extraction on a plurality of blocks in parallel. That is, the plurality of feature extraction units may perform feature extraction in parallel (or referred to as simultaneously), which also helps shorten time required for feature extraction, thereby shortening the decoding time. Finally, with reference to the foregoing two aspects, when a neural network decoder is used for performing QEC decoding, the decoding time is fully shortened, thereby meeting a real-time error correction requirement.

In addition, the neural network decoder may use a logic-class output, which helps reduce complexity thereof, thereby further shortening the decoding time.

In this disclosure, for ease of description, a type of intuitive simple decoders is used in a fault tolerant and error correction decoding framework. Actually, any simple decoder may be used, and all simple decoders are equivalent in principle. In description of the solution, a rotated surface code is used as an example. This disclosure may be extended to another surface code having a boundary. Extraction may be performed on a circuit by correcting error syndromes, adding a leakage reduction unit (LRU), so that an entire fault tolerant and error correction protocol can detect a state leakage of qubits. Then a fault tolerant and error correction protocol with excellent performance and containing an LRU may be used for training a neural network. During decoding, logic error classes and error syndromes are classified to obtain a fault tolerant and error correction decoding algorithm for inhibiting a state leakage. In principle, this disclosure may be extended to other quantum topology error correction codes, including a high dimension toric code, a hyperbolic code, and a color code. But during use of other topology error correction codes, a technology such as one-shot or flag qubit needs to be used during a syndrome measurement (parity check), which increases complexity of the solution, and may decrease error correction performance. The fault tolerant and error correction decoding framework provided in this disclosure may be applied to all neural networks (include but are not limited to a CNN, an RNN, and the like) that perform limited classification on three-dimensional discrete arrays, and a difference lies in that different neural networks cause differences in decoding performance and real-time decoding time. In this disclosure, a superconducting quantum computing platform is used as an example, but due to the general purpose of the algorithm, this disclosure may also be applied to any quantum computing physical platform.

The following describes apparatus embodiments of this disclosure, which can be used for executing the method embodiments of this disclosure. For details not disclosed in the apparatus embodiments of this disclosure, refer to the method embodiments of this disclosure.

Figure 22:
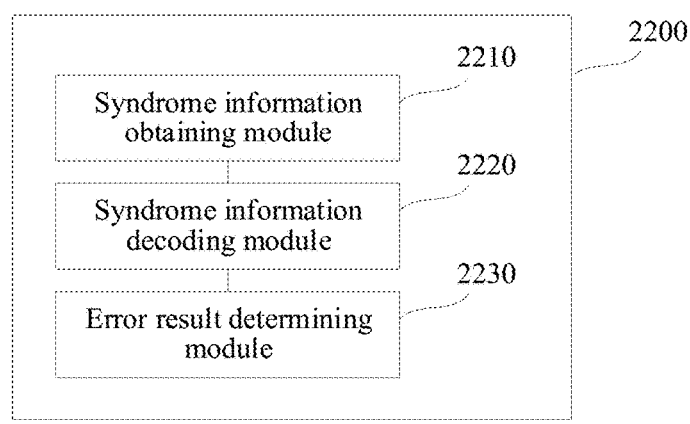
FIG. 22 is a block diagram of a fault tolerant and error correction decoding apparatus for a quantum circuit according to an embodiment of this disclosure.

FIG. 22 is a block diagram of a fault tolerant and error correction decoding apparatus for a quantum circuit according to an embodiment of this disclosure. The apparatus has a function of implementing the foregoing method embodiments. The function may be implemented by hardware, or may be implemented by hardware executing corresponding software. The apparatus may be a computer device or may be disposed in a computer device. The apparatus 2200 may include a syndrome information obtaining module 2210, a syndrome information decoding module 2220, and an error result determining module 2230.

The syndrome information obtaining module 2210 is configured to obtain actual error syndrome information of a quantum circuit, the actual error syndrome information being information obtained by performing a noisy error syndrome measurement on the quantum circuit by using a QEC code.

The syndrome information decoding module 2220 is configured to decode the actual error syndrome information to obtain a logic error class and perfect error syndrome information that correspond to the actual error syndrome information, the logic error class being a class obtained through mapping of an error occurring in the quantum circuit, and the perfect error syndrome information being information obtained by performing a noise-free error syndrome measurement on the quantum circuit.

The error result determining module 2230 is configured to determine error result information of the quantum circuit based on the logic error class and the perfect error syndrome information, the error result information being used for indicating a data qubit in which an error occurs in the quantum circuit and a corresponding error class.

Figure 23:
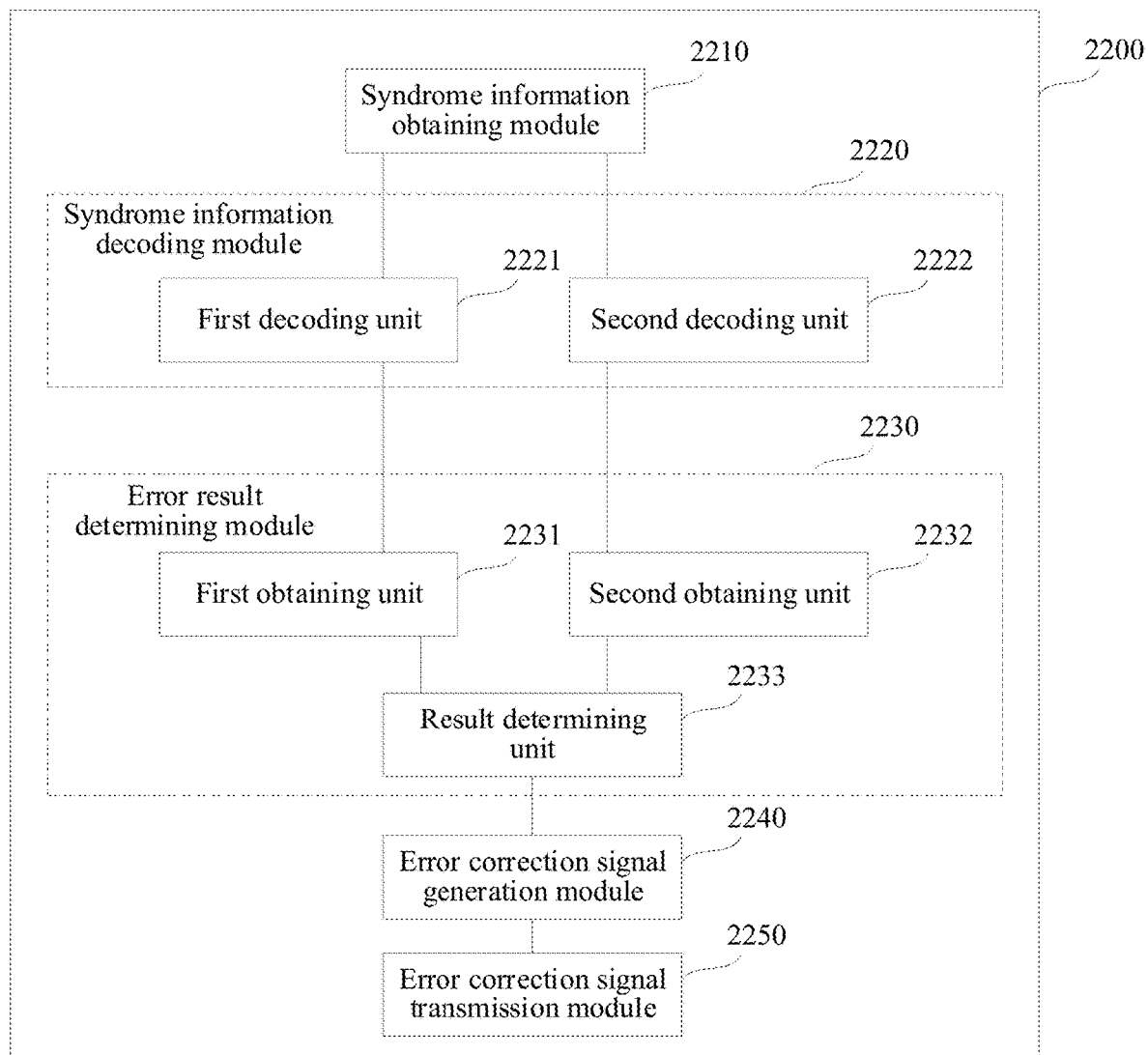
FIG. 23 is a block diagram of a fault tolerant and error correction decoding apparatus for a quantum circuit according to another embodiment of this disclosure.

In an exemplary embodiment, as shown in FIG. 23, the syndrome information decoding module 2220 includes a first decoding unit 2221 and a second decoding unit 2222.

The first decoding unit 2221 is configured to decode the actual error syndrome information by using a first decoder, to obtain the logic error class corresponding to the actual error syndrome information, the first decoder being a neural network classifier configured to determine the logic error class.

The second decoding unit 2222 is configured to decode the actual error syndrome information by using a second decoder, to obtain the perfect error syndrome information corresponding to the actual error syndrome information, the second decoder being a neural network classifier configured to determine the perfect error syndrome information.

In an exemplary embodiment, the first decoding unit 2221 is configured to:
partition the actual error syndrome information by using the first decoder, to obtain at least two blocks; and
perform feature extraction on the at least two blocks in parallel by using at least two feature extraction units, to obtain feature information; and
perform fusion decoding on the feature information by using the first decoder, to obtain the logic error class corresponding to the actual error syndrome information.

In an exemplary embodiment, the second decoding unit 2222 is configured to:
respectively input the actual error syndrome information into k second decoders, to obtain k perfect error syndrome bits, k being a positive integer and k being related to a scale of the QEC code; and
integrate the k perfect error syndrome bits, to obtain the perfect error syndrome information corresponding to the actual error syndrome information.

In an exemplary embodiment, a training process of the first decoder and the second decoder is as follows:

simulating a data error and a measurement error of a sample quantum circuit, to obtain a simulation result, the data error being an error occurring on a data qubit of the sample quantum circuit, and the measurement error being an error occurring during an error syndrome measurement;
obtaining, based on the simulation result, error syndrome information of the sample quantum circuit in T error syndrome measurements, T being an integer greater than 1;
determining equivalent data error information obtained by projecting the T pieces of error syndrome information to a target time point;
determining a logic error class and perfect error syndrome information that correspond to the equivalent data error information;
constructing a training sample, sample data of the training sample including the T pieces of error syndrome information, the training sample including label data, the label data including the logic error class and the perfect error syndrome information that correspond to the equivalent data error information; and
training the first decoder and the second decoder by using the training sample.

In an exemplary embodiment, the simulating a data error and a measurement error of a sample quantum circuit includes:
probabilistically generating an error on a data qubit included in the sample quantum circuit;
probabilistically generating an error on an auxiliary qubit corresponding to the sample quantum circuit, the auxiliary qubit being configured to measure the error syndrome information of the sample quantum circuit;
probabilistically generating an error on a controlled-not (CNOT) gate included in an eigenvalue measurement circuit, the eigenvalue measurement circuit being corresponding to the sample quantum circuit, and being configured to measure an eigenvalue of a stabilizer generator; and
probabilistically generating a measurement error when an error syndrome measurement is performed on the sample quantum circuit by using the QEC code.

In an exemplary embodiment, the simulating a data error and a measurement error of a sample quantum circuit includes:
performing QPT on the sample quantum circuit, to extract a noise model of the sample quantum circuit, the noise model being configured to generate the data error and the measurement error through simulation; and
simulating an evolution of a quantum state of the sample quantum circuit under the action of noise based on the noise model.

In an exemplary embodiment, a training process of the first decoder and the second decoder is as follows:
performing a noisy error syndrome measurement on the sample quantum circuit, to obtain error syndrome information of the sample quantum circuit;
decoding the error syndrome information of the sample quantum circuit by using another decoder to obtain a logic error class and perfect error syndrome information that correspond to the error syndrome information of the sample quantum circuit;
constructing a training sample, sample data of the training sample including the error syndrome information of the sample quantum circuit, the training sample including label data, the label data including the logic error class and the perfect error syndrome information that correspond to the error syndrome information of the sample quantum circuit; and training the first decoder and the second decoder by using the training sample.

In an exemplary embodiment, as shown in FIG. 23, the error result determining module 2230 includes a first obtaining unit 2231, a second obtaining unit 2232, and a result determining unit 2233.

The first obtaining unit 2231 is configured to obtain a first error result corresponding to the logic error class.

The second obtaining unit 2232 is configured to obtain a second error result corresponding to the perfect error syndrome information.

The result determining unit 2233 is configured to determine the error result information of the quantum circuit based on the first error result and the second error result.

In an exemplary embodiment, the first obtaining unit 2231 is configured to select any element from elements included in the logic error class as the first error result, the logic error class including at least one equivalent error element.

In an exemplary embodiment, the second obtaining unit 2232 is configured to: search a mapping table for simple errors respectively corresponding to error syndrome points in the perfect error syndrome information, the mapping table including at least one set of mapping relationship between an error syndrome point and a simple error; and multiply the simple errors respectively corresponding to the error syndrome points, to obtain the second error result.

In an exemplary embodiment, the result determining unit 2233 is configured to determine a product of the first error result and the second error result, to obtain the error result information of the quantum circuit.

In an exemplary embodiment, as shown in FIG. 23, the apparatus 2200 further includes an error correction signal generation module 2240 and an error correction signal transmission module 2250.

The error correction signal generation module 2240 is configured to generate an error correction control signal based on the error result information, the error correction control signal being used for correcting an error occurring in the quantum circuit.

The error correction signal transmission module 2250 is configured to transmit the error correction control signal to the quantum circuit.

The term module (and other similar terms such as unit, submodule, subunit, etc.) in this disclosure may refer to a software module, a hardware module, or a combination thereof. A software module (e.g., computer program) may be developed using a computer programming language. A hardware module may be implemented using processing circuitry and/or memory. Each module can be implemented using one or more processors (or processors and memory). Likewise, a processor (or processors and memory) can be used to implement one or more modules. Moreover, each module can be part of an overall module that includes the functionalities of the module.

Based on the above, in the technical solution provided in this embodiment of this disclosure, by decoding actual error symptom information of a quantum circuit to obtain a corresponding logic error class and corresponding perfect error syndrome information and then determining a data qubit in which an error occurs in the quantum circuit and a corresponding error class according to the logic error class and the perfect error syndrome information, this disclosure achieves fault tolerant and error correction decoding on error syndrome information of the quantum circuit when the error syndrome information is not perfect.

In addition, this solution equivalently transforms fault tolerant and error correction decoding into a classification problem, so that fault tolerant and error correction decoding can be performed on error syndrome information by using an efficient neural network classifier, thereby improving the fault tolerant and error correction decoding speed, and achieving real-time fault tolerant and error correction decoding. If a suitable neural network classifier is selected, the speed of the decoding algorithm can be greatly improved, thereby paving the way for implementation of real-time fault tolerant and error correction decoding.

When the apparatus provided in the foregoing embodiments implements its functions, a description is given only by using the foregoing division of function modules as an example. In actual applications, the functions may be allocated to and implemented by different function modules according to the requirements, that is, the internal structure of the device may be divided into different function modules, to implement all or some of the functions described above. In addition, the apparatus and method embodiments provided in the foregoing embodiments belong to the same concept. For the specific implementation process, reference may be made to the method embodiments, and details are not described herein again.

Figure 24:
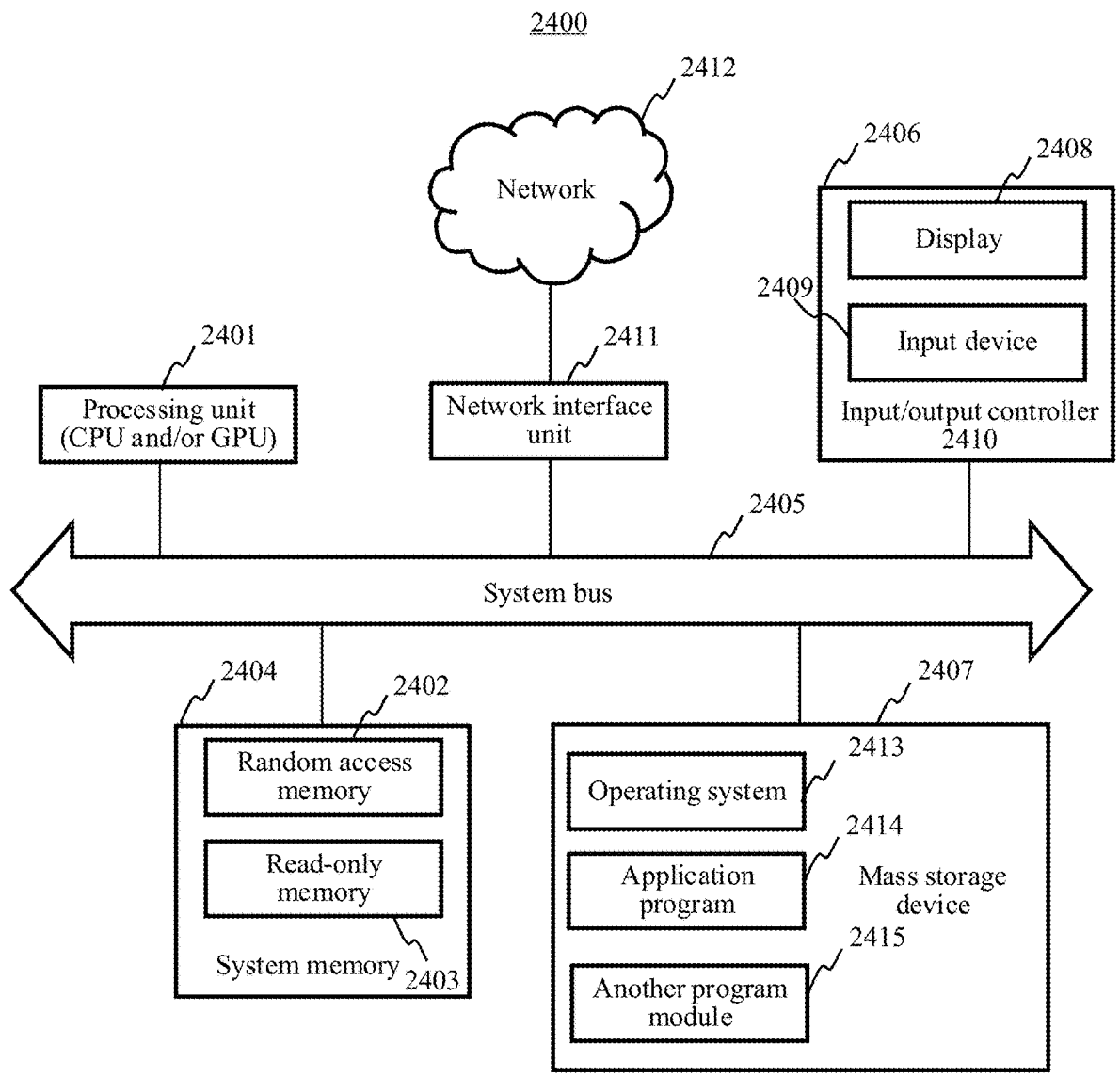
FIG. 24 is a schematic structural diagram of a computer device according to an embodiment of this disclosure.

FIG. 24 is a schematic structural diagram of a computer device according to an embodiment of this disclosure. The computer device may be the control device 33 in the application scenario of the solution shown in FIG. 3. The computer device may be configured to implement the fault tolerant and error correction decoding method for a quantum circuit provided in the foregoing embodiments.

The computer device 2400 includes a processing unit 2401 (for example, a central processing unit (CPU) and/or a graphics processing unit (GPU)), a system memory 2404 including a random access memory (RAM) 2402 and a read-only memory (ROM) 2403, and a system bus 2405 connecting the system memory 2404 to the processing unit 2401. The computer device 2400 further includes a basic input/output system (I/O system) 2406 assisting in transmission of information between components in the computer device, and a mass storage device 2407 configured to store an operating system 2413, an application program 2414, and other program module 2415.

The basic I/O system 2406 includes a display 2408 configured to display information and an input device 2409 configured for a user to input information, such as a mouse or a keyboard. The display 2408 and the input device 2409 are both connected to the processing unit 2401 by an input/output controller 2410 connected to the system bus 2405. The basic I/O system 2406 may further include the input/output controller 2410, to receive and process inputs from a plurality of other devices, such as a keyboard, a mouse, or an electronic stylus. Similarly, the input/output controller 2410 further provides an output to a display screen, a printer, or other types of output devices.

The mass storage device 2407 is connected to the processing unit 2401 by a mass storage controller (not shown) connected to the system bus 2405. The mass storage device 2407 and a computer-readable medium associated with the mass storage device provide non-volatile storage for the computer device 2400. That is, the mass storage device 2407 may include a computer-readable medium (not shown) such as a hard disk or a compact disc ROM (CD-ROM) drive.

Without loss of generality, the computer-readable media may include a computer storage medium and a communication medium. The computer storage medium includes volatile and non-volatile media, and removable and non-removable media configured to store information such as computer-readable instructions, data structures, program modules, or other data and implemented by using any method or technique. The computer storage medium includes a RAM, a ROM, an erasable programmable ROM (EPROM), an electrically erasable programmable ROM (EEPROM), a flash memory or other solid-state memory technology, a CD-ROM, a digital versatile disc (DVD) or other optical storage, a tape cartridge, a magnetic cassette, a magnetic disk storage, or other magnetic storage device. Certainly, a person skilled in the art may understand that the computer storage medium is not limited to the foregoing several types. The system memory 2404 and the mass storage device 2407 may be collectively referred to as a memory.

According to various embodiments of this disclosure, the computer device 2400 may further be connected, through a network such as the Internet, to a remote computer on the network for running. That is, the computer device 2400 may be connected to a network 2412 by a network interface unit 2411 connected to the system bus 2405, or may be connected to other types of networks or remote computer systems (not shown) by the network interface unit 2411.

The memory stores at least one instruction, at least one program segment, a code set, or an instruction set, the at least one instruction, the at least one program segment, the code set, or the instruction set being configured to be executed by one or more processors to implement the fault tolerant and error correction decoding method for a quantum circuit provided in the foregoing embodiments.

In an exemplary embodiment, a computer-readable storage medium is further provided. The storage medium stores at least one instruction, at least one program segment, a code set, or an instruction set, the at least one instruction, the at least one program segment, the code set, or the instruction set being configured to be executed by the processor of a computer device to implement the fault tolerant and error correction decoding method for a quantum circuit provided in the foregoing embodiments. In an exemplary embodiment, the computer-readable storage medium may be a ROM, a RAM, a CD-ROM, a magnetic tape, a floppy disk, an optical data storage device, or the like.

In an exemplary embodiment, a computer program product is further provided. The computer program product, when executed, is configured to implement the fault tolerant and error correction decoding method for a quantum circuit provided in the foregoing embodiments.

In an exemplary embodiment, a chip is further provided, including a programmable logic circuit and/or program instructions. The chip is configured to run on a computer device to implement the fault tolerant and error correction decoding method for a quantum circuit provided in the foregoing embodiments.

Optionally, the chip is an FPGA chip or an ASIC chip.

"Plurality of" mentioned in the specification means two or more. "And/or" describes an association relationship for describing associated objects and represents that three relationships may exist. For example, A and/or B may represent the following three cases: Only A exists, both A and B exist, and only B exists. The character "I" in this specification generally indicates an "or" relationship between the associated objects. In addition, the step numbers described in this specification merely exemplarily show a possible execution sequence of the steps. In some other embodiments, the steps may not be performed according to the number sequence. For example, two steps with different numbers may be performed simultaneously, or two steps with different numbers may be performed according to a sequence contrary to the sequence shown in the figure, which is not limited in the embodiments of this disclosure.

The foregoing descriptions are merely exemplary embodiments of this disclosure, but are not intended to limit this disclosure. Any modification, equivalent replacement, or improvement made within the spirit and principle of this disclosure shall fall within the protection scope of this disclosure.

What is claimed is:

1. A fault tolerant and error correction decoding method for a quantum circuit, applicable to a computer device, the method comprising:
    obtaining actual error syndrome information of a quantum circuit by performing a noisy error syndrome measurement on the quantum circuit using a quantum error correction (QEC) code;
    decoding the actual error syndrome information to obtain a logic error class and perfect error syndrome information, which correspond to the actual error syndrome information, the logic error class being a class obtained through mapping of an error occurring in the quantum circuit and the perfect error syndrome information being obtained by performing a noise-free error syndrome measurement on the quantum circuit; and
    determining error result information of the quantum circuit based on the logic error class and the perfect error syndrome information, the error result information being indicative of a data qubit in which an error occurs in the quantum circuit and a corresponding error class.

2. The method according to claim 1, wherein decoding the actual error syndrome information to obtain a logic error class and perfect error syndrome information comprises:
    decoding the actual error syndrome information using a first decoder to obtain the logic error class corresponding to the actual error syndrome information, the first decoder being a neural network classifier configured to determine the logic error class; and
    decoding the actual error syndrome information using one or more second decoders to obtain the perfect error syndrome information corresponding to the actual error syndrome information, the one or more second decoders being a neural network classifier configured to determine the perfect error syndrome information.

3. The method according to claim 2, wherein decoding the actual error syndrome information using the first decoder to obtain the logic error comprises:
    partitioning the actual error syndrome information using the first decoder to obtain at least two blocks;
    performing feature extraction on the at least two blocks in parallel to obtain feature information; and
    performing fusion decoding on the feature information by using the first decoder to obtain the logic error class.

4. The method according to claim 2, wherein decoding the actual error syndrome information using the one or more second decoders to obtain the perfect error syndrome information comprises:
    respectively inputting the actual error syndrome information into k second decoders to obtain k perfect error syndrome bits, k being a positive integer and k being related to a scale of the QEC code; and
    integrating the k perfect error syndrome bits to obtain the perfect error syndrome information corresponding to the actual error syndrome information.

5. The method according to claim 2, further comprising training the first decoder and the one or more second decoders by:
  simulating a data error and a measurement error of a sample quantum circuit to obtain a simulation result, the data error occurring on a data qubit of the sample quantum circuit and the measurement error occurring during an error syndrome measurement;
  obtaining, based on the simulation result, T pieces of error syndrome information of the sample quantum circuit from T error syndrome measurements, T being an integer greater than 1;
  determining equivalent data error information obtained by projecting the T pieces of error syndrome information to a target time point;
  determining a logic error class and perfect error syndrome information that correspond to the equivalent data error information;
  constructing a training sample, sample data of the training sample comprising the T pieces of error syndrome information, the training sample comprising label data, the label data comprising the logic error class and the perfect error syndrome information that correspond to the equivalent data error information; and
  training the first decoder and the one or more second decoders by using the training sample.

6. The method according to claim 5, wherein simulating the data error and the measurement error of the sample quantum circuit comprises:
  probabilistically generating an error on a data qubit comprised in the sample quantum circuit;
  probabilistically generating an error on an auxiliary qubit corresponding to the sample quantum circuit, the auxiliary qubit being configured to measure the error syndrome information of the sample quantum circuit;
  probabilistically generating an error on a controlled-not (CNOT) gate comprised in an eigenvalue measurement circuit, the eigenvalue measurement circuit being corresponding to the sample quantum circuit and being configured to measure an eigenvalue of a stabilizer generator; and
  probabilistically generating a measurement error when an error syndrome measurement is performed on the sample quantum circuit by using the QEC code.

7. The method according to claim 5, wherein simulating the data error and the measurement error of the sample quantum circuit comprises:
  performing quantum process tomography (QPT) on the sample quantum circuit to extract a noise model of the sample quantum circuit, the noise model being configured to generate the data error and the measurement error through simulation; and
  simulating an evolution of a quantum state of the sample quantum circuit under the action of noise based on the noise model.

8. The method according to claim 2, further comprising training the first decoder and the one or more second decoders by:
  performing a noisy error syndrome measurement on the sample quantum circuit to obtain error syndrome information of the sample quantum circuit;
  decoding the error syndrome information of the sample quantum circuit by using another decoder to obtain a logic error class and perfect error syndrome information, which correspond to the error syndrome information of the sample quantum circuit;
  constructing a training sample, sample data of the training sample comprising the error syndrome information of the sample quantum circuit, the training sample comprising label data, and the label data comprising the logic error class and the perfect error syndrome information; and
  training the first decoder and the one or more second decoders by using the training sample.

9. The method according to claim 1, wherein determining the error result information of the quantum circuit based on the logic error class and the perfect error syndrome information comprises:
  obtaining a first error result corresponding to the logic error class;
  obtaining a second error result corresponding to the perfect error syndrome information; and
  determining the error result information of the quantum circuit based on the first error result and the second error result.

10. The method according to claim 9, wherein obtaining the first error result corresponding to the logic error class comprises:
  selecting any element from elements comprised in the logic error class as the first error result,
  the logic error class comprising at least one equivalent error element.

11. The method according to claim 9, wherein obtaining the second error result corresponding to the perfect error syndrome information comprises:
  searching a mapping table for simple errors respectively corresponding to error syndrome points in the perfect error syndrome information, the mapping table comprising at least one set of mapping relationship between an error syndrome point and a simple error; and
  multiplying the simple errors respectively corresponding to the error syndrome points to obtain the second error result.

12. The method according to claim 9, wherein determining the error result information of the quantum circuit based on the first error result and the second error result comprises:
  determining a product of the first error result and the second error result to obtain the error result information of the quantum circuit.

13. The method according to claim 1, wherein after determining error result information of the quantum circuit based on the logic error class and the perfect error syndrome information, the method further comprises:
  generating an error correction control signal based on the error result information for correcting an error occurring in the quantum circuit; and
  transmitting the error correction control signal to the quantum circuit.

14. An electronic component, comprising a programmable logic circuit and/or program instructions, the electronic component being configured to run on a computer device to cause the computer device to perform the steps comprising:
  obtaining actual error syndrome information of a quantum circuit by performing a noisy error syndrome measurement on the quantum circuit using a quantum error correction (QEC) code;
  decoding the actual error syndrome information to obtain a logic error class and perfect error syndrome information, which correspond to the actual error syndrome information, the logic error class being a class obtained through mapping of an error occurring in the quantum circuit and the perfect error syndrome information being obtained by performing a noise-free error syndrome measurement on the quantum circuit; and determining error result information of the quantum circuit based on the logic error class and the perfect error syndrome information, the error result information being indicative of a data qubit in which an error occurs in the quantum circuit and a corresponding error class.

15. The electronic component of claim 14, wherein the electronic component is configured to run on the computer device to cause the computer device to decode the actual error syndrome information to obtain a logic error class and perfect error syndrome information by:

decoding the actual error syndrome information using a first decoder to obtain the logic error class corresponding to the actual error syndrome information, the first decoder being a neural network classifier configured to determine the logic error class; and decoding the actual error syndrome information using one or more second decoders to obtain the perfect error syndrome information corresponding to the actual error syndrome information, the one or more second decoders being a neural network classifier configured to determine the perfect error syndrome information.

16. The electronic component of claim 15, wherein the electronic component is configured to run on the computer device to cause the computer device to decode the actual error syndrome information using the first decoder to obtain the logic error by:

partitioning the actual error syndrome information using the first decoder to obtain at least two blocks;

performing feature extraction on the at least two blocks in parallel to obtain feature information; and performing fusion decoding on the feature information using the first decoder to obtain the logic error class.

17. The electronic component of claim 15, wherein the electronic component is configured to run on the computer device to cause the computer device to decode the actual error syndrome information using the one or more second decoders to obtain the perfect error syndrome information by:

respectively inputting the actual error syndrome information into k second decoders to obtain k perfect error syndrome bits, k being a positive integer and k being related to a scale of the QEC code; and integrating the k perfect error syndrome bits to obtain the perfect error syndrome information corresponding to the actual error syndrome information.

18. The electronic component of claim 14, wherein the electronic component is configured to run on the computer device to cause the computer device to determine error result information of the quantum circuit based on the logic error class and the perfect error syndrome information by:

obtaining a first error result corresponding to the logic error class;

obtaining a second error result corresponding to the perfect error syndrome information; and determining the error result information of the quantum circuit based on the first error result and the second error result.

19. The electronic component of claim 18, wherein the electronic component is configured to run on the computer device to cause the computer device to obtain the first error result corresponding to the logic error class by:

selecting any element from elements comprised in the logic error class as the first error result, the logic error class comprising at least one equivalent error element.

20. The electronic component of claim 14, wherein the electronic component is further configured to run on the computer device to cause the computer device to:

generate an error correction control signal based on the error result information for correcting an error occurring in the quantum circuit; and transmit the error correction control signal to the quantum circuit.

* * * * *